United States Patent
Wu et al.

(10) Patent No.: US 11,630,386 B2
(45) Date of Patent: Apr. 18, 2023

(54) REFLECTIVE MASK AND FABRICATING METHOD THEREOF

(71) Applicant: TAIWAN SEMICONDUCTOR MANUFACTURING CO., LTD., Hsinchu (TW)

(72) Inventors: Tsiao-Chen Wu, Hsinchu County (TW); Pei-Cheng Hsu, Taipei (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 17/579,433

(22) Filed: Jan. 19, 2022

(65) Prior Publication Data

US 2022/0146924 A1 May 12, 2022

Related U.S. Application Data

(62) Division of application No. 16/656,227, filed on Oct. 17, 2019, now Pat. No. 11,243,461.

(60) Provisional application No. 62/750,775, filed on Oct. 25, 2018.

(51) Int. Cl.
*G03F 1/24* (2012.01)
*G03F 1/80* (2012.01)
*G03F 1/40* (2012.01)

(52) U.S. Cl.
CPC .......... *G03F 1/24* (2013.01); *G03F 1/40* (2013.01); *G03F 1/80* (2013.01)

(58) Field of Classification Search
CPC ............ G03F 1/24; G03F 1/40; G03F 1/80
USPC .................................................. 430/5
See application file for complete search history.

(56) References Cited

U.S. PATENT DOCUMENTS

| | | |
|---|---|---|
| 8,592,103 B2 | 11/2013 | Mangat et al. |
| 8,764,995 B2 | 7/2014 | Chang et al. |
| 8,765,331 B2 | 7/2014 | Gallagher et al. |
| 8,796,666 B1 | 8/2014 | Huang et al. |
| 8,802,335 B2 | 8/2014 | Oh et al. |
| 8,828,625 B2 | 9/2014 | Lu et al. |
| 8,841,047 B2 | 9/2014 | Yu et al. |
| 8,877,409 B2 | 11/2014 | Hsu et al. |
| 9,093,530 B2 | 7/2015 | Huang et al. |
| 9,184,054 B1 | 11/2015 | Huang et al. |
| 9,256,123 B2 | 2/2016 | Shih et al. |
| 9,529,268 B2 | 12/2016 | Chang et al. |
| 9,548,303 B2 | 1/2017 | Lee et al. |
| 10,481,483 B2 | 11/2019 | Wang et al. |

OTHER PUBLICATIONS

Manuel A. Quijada et al., "Hemispherical Reflectance and Emittance Properties of Carbon Nanotubes Coatings at Infrared Wavelengths,", Proc. of SPIE vol. 8150, 815002-1 (2011).
J. T. McCartney et al., "Optical Properties of Coal and Graphite", Bureau of Mines Bulletin 0641 (1967).
Robert de Kruif et al., "Impact of an etched EUV mask Black Border on imaging and overlay" 2012 International Symposium on Extreme Ultraviolet Lithography, Sep. 30-Oct. 4, 2012.
Yutaka Kodera et al., "Novel EUV Mask Black Border and its Impact on Wafer Imaging", Proc. of SPIE vol. 9776 977615-1 (2016).
Oi. A. Savchuk et al., "Determination of photothermal conversion efficiency of graphene and graphene oxide through an integrating sphere method", Carbon 103 (2016) 134-141.
Ji Ung Lee, "Photovoltaic effect in ideal carbon nanotube diodes", Applied Physics Letter 87, 073101 (2005).

*Primary Examiner* — Christopher G Young
(74) *Attorney, Agent, or Firm* — Maschoff Brennan

(57) ABSTRACT

The prevent disclosure provides a reflective mask. In some embodiments, the reflective mask includes a substrate, a $sp^2$-hybrid carbon layer, a reflective multilayer, and an absorption pattern. The $sp^2$-hybrid carbon layer is over the substrate. The reflective multilayer is over the $sp^2$-hybrid carbon layer. The absorption pattern is over the reflective multilayer.

20 Claims, 23 Drawing Sheets

S10

S12

S14

REFLECTIVE MASK AND FABRICATING METHOD THEREOF

PRIORITY CLAIM AND CROSS-REFERENCE

The present application is a Divisional Application of the U.S. application Ser. No. 16/656,227, filed Oct. 17, 2019, which claims priority to U.S. Provisional Application Ser. No. 62/750,775, filed Oct. 25, 2018, which is herein incorporated by reference in their entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, an extreme ultraviolet lithography (EUVL) is implemented to meet a need of a higher resolution lithography process.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
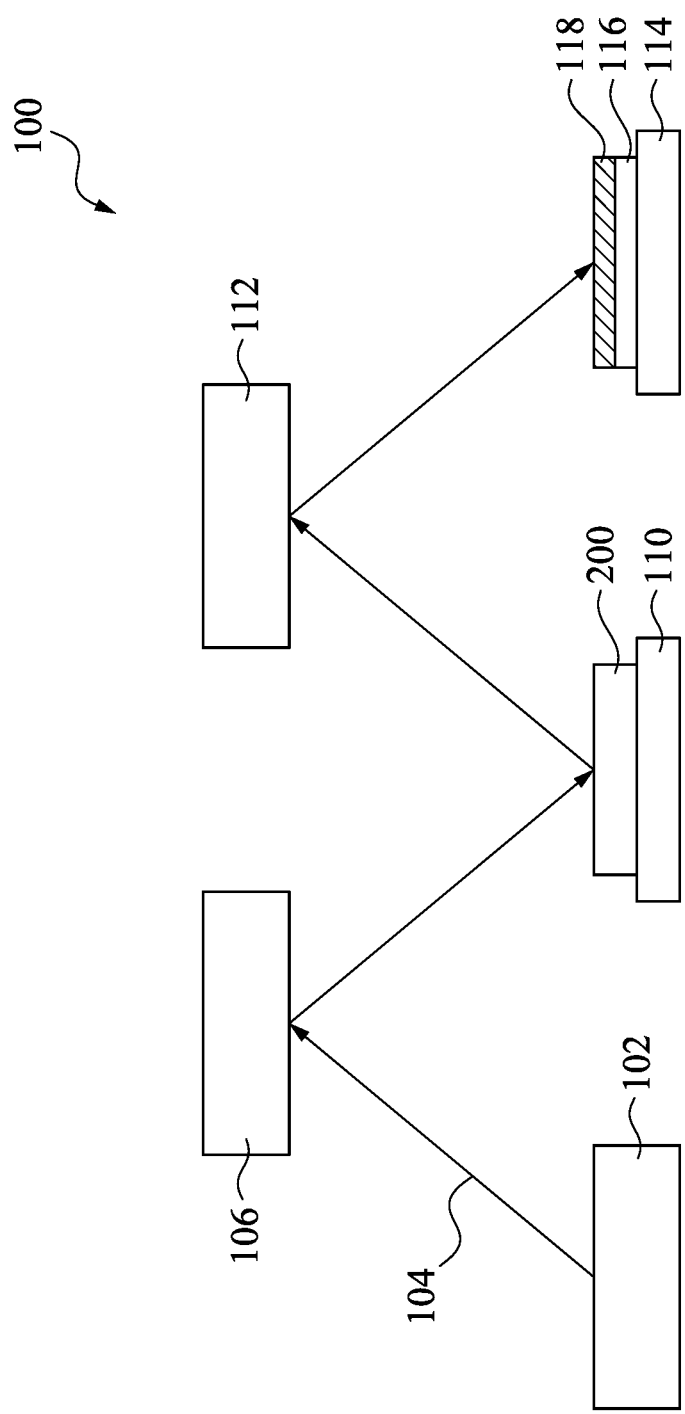
FIG. 1 is a schematic diagram of an extreme ultraviolet (EUV) lithography system according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The advanced lithography process, method, and materials described in the current disclosure can be used in many applications, including fin-type field effect transistors (FinFETs). For example, the fins may be patterned to produce a relatively close spacing between features, for which some embodiments of the following disclosure are well suited. In addition, spacers used in forming fins of FinFETs can be processed according to some embodiments of the following disclosure.

FIG. 1 is a schematic diagram of an extreme ultraviolet (EUV) lithography system 100 according to some embodiments of the present disclosure. The EUV lithography system 100 includes a radiation source 102, condenser optics 106, a mask stage 110, projection optics 112, and a substrate stage 114. However, other configurations and inclusion or omission of the device may be possible. In some embodiments of the present disclosure, the EUV lithography system 100 is also referred to as a stepper or a scanner. In some embodiments of the present disclosure, the radiation source 102 is configured to provide EUV light 104 having a wavelength in the EUV range. For example, the radiation source 102 may emit the EUV light 104 using carbon dioxide ($CO_2$) laser produced tin (Sn) plasma.

The condenser optics 106 includes a multilayer coated collector and a plurality of grazing mirrors and is configured to collect and shape the EUV light 104 and provide a slit of the EUV light 104 to a reflective mask 200 on the mask stage 110. The EUV light 104 provided and transmitted to the reflective mask 200 is then reflected by the reflective mask 200 according to design information on the reflective mask 200. The reflective mask 200 is also referred to as a mask, a photo mask, or a reticle. The mask stage 110 includes a plurality of motors, roller guides, and tables; secures the reflective mask 200 on the mask stage 110; and provides the accurate position and movement of the reflective mask 200 in X, Y and Z directions during alignment, focus, leveling and exposure operation in the EUV lithography system 100. The projection optics 112 includes a plurality of mirrors, projecting the light reflected by the reflective mask 200 onto a resist film 118 deposited on a wafer 116 secured by the substrate stage 114. The substrate stage 114 includes motors, roller guides, and tables; secures the wafer 116 on the substrate stage 114; and provides the accurate position and movement of the wafer 116 in X, Y and Z directions during alignment, focus, leveling and exposing operation in the EUV lithography system 100 so that the image of the reflective mask 200 is transferred onto the resist film 118 in a repetitive fashion (though other lithography methods are possible). The system 100, or portions thereof, may include additional items, such as a vacuum system and/or a cooling system.

The wafer 116 coated with the resist film 118 is loaded on the substrate stage 114 for exposure by the light reflected from the reflective mask 200. The resist film 118 is also referred to as a photo resist, a resist, or a photo resist film. The resist film 118 includes a positive tone resist or a negative tone resist. The wafer 116 includes a wafer substrate.

Figure 2:
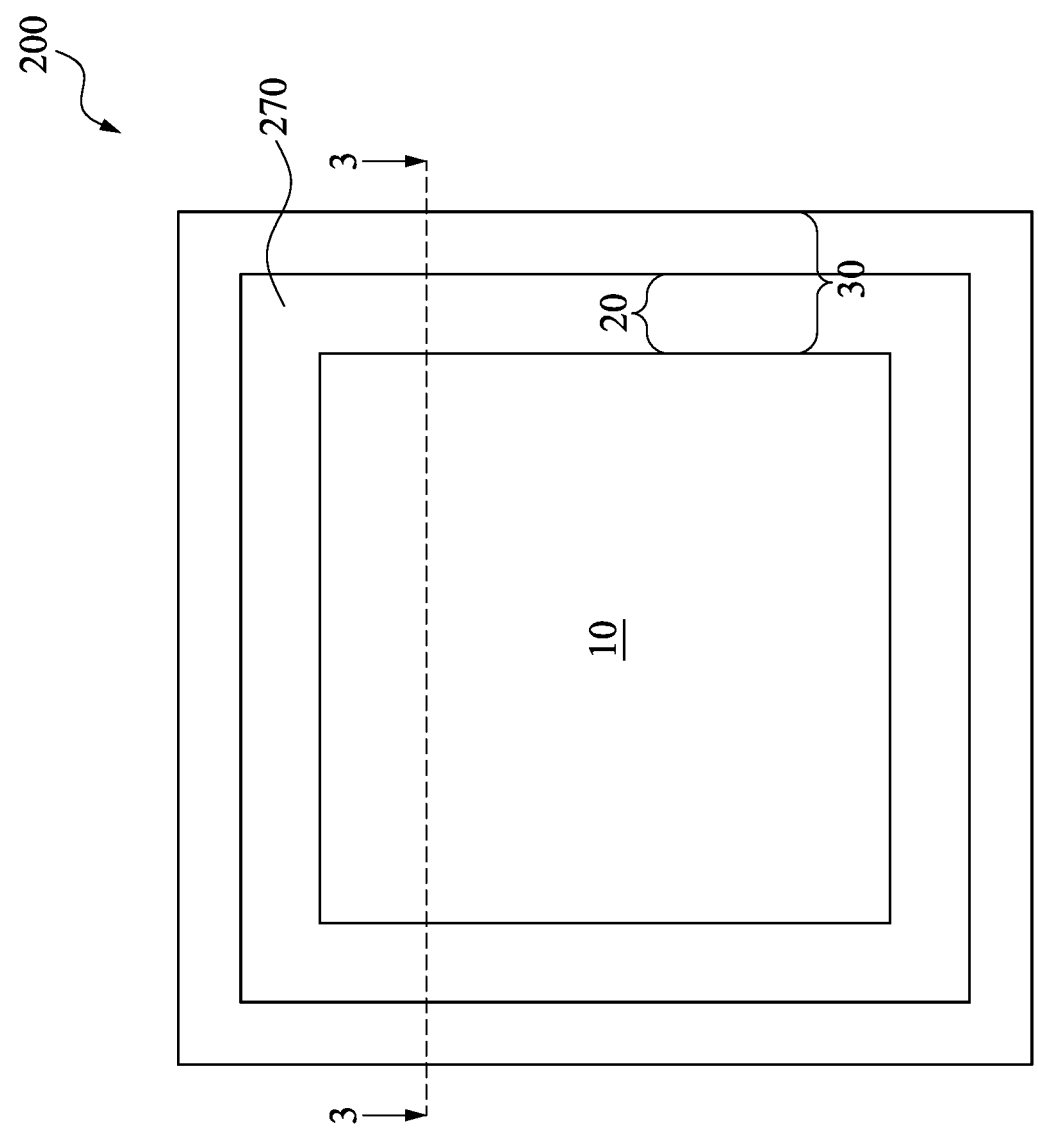
FIG. 2 is a top schematic view of the reflective mask of FIG. 1, in portion or entirety, according to some embodiments of the present disclosure.

Reference is made to both FIG. 1 and FIG. 2, in which FIG. 2 is a top schematic view of the reflective mask 200 of FIG. 1, in portion or entirety, according to some embodiments of the present disclosure. The reflective mask 200 in the EUV lithography system 100 includes an image zone 10 and a frame zone 30. The image zone 10 is formed according to the integrated circuit (IC) design layout pattern. The image zone 10 includes absorptive regions, which absorb light incident thereon, and reflective regions, which reflect light incident thereon. The reflective and absorptive regions of the image zone 10 are patterned such that light reflected from the reflective regions projects onto the wafer 116 and transfers the pattern of the image zone 10 to the resist film 118 which is coated on the wafer 116. The pattern of the image zone 10 can be transferred to multiple fields of the resist film 118 multiple times using multiple exposures with the reflective mask 200.

For each exposure process, the EUV lithography system 100 defines a portion of the reflective mask 200 for exposing light thereon. An exposure slit of the lithography system 100 may define the portion of the reflective mask 200 that will be exposed to the EUV light, including the image zone 10 and a black border zone 20 adjacent to and surrounding the image zone 10. The black border zone 20 of the reflective mask 200 is in the frame zone 30. The black border zone 20 on the reflective mask 200 corresponds to an edge between patterned fields on the resist film 118. Given that the black border zone 20 of the reflective mask 200 is exposed to the EUV light during the exposure process, if the black border zone 20 undesirably reflects a portion of light to the resist film 118, the edge between the patterned fields on the resist film 118 receives intended light intensity and extra background reflected light from the black border zone 20. By etching away the reflective multilayer (ML), the black border zone 20 may eliminate EUV light reflectivity, but not out of band (OoB) light reflectivity such as deep ultraviolet (DUV) light reflectivity. The DUV light projected onto the edge between the patterned fields on the resist film 118 causes the dose deviation from the target and the critical dimension (CD) error. Therefore, the black border zone 20 is configured to have no or minimal reflectivity for EUV light and OoB light such as DUV light and is configured to not image a pattern onto the resist film 118.

Figure 3:
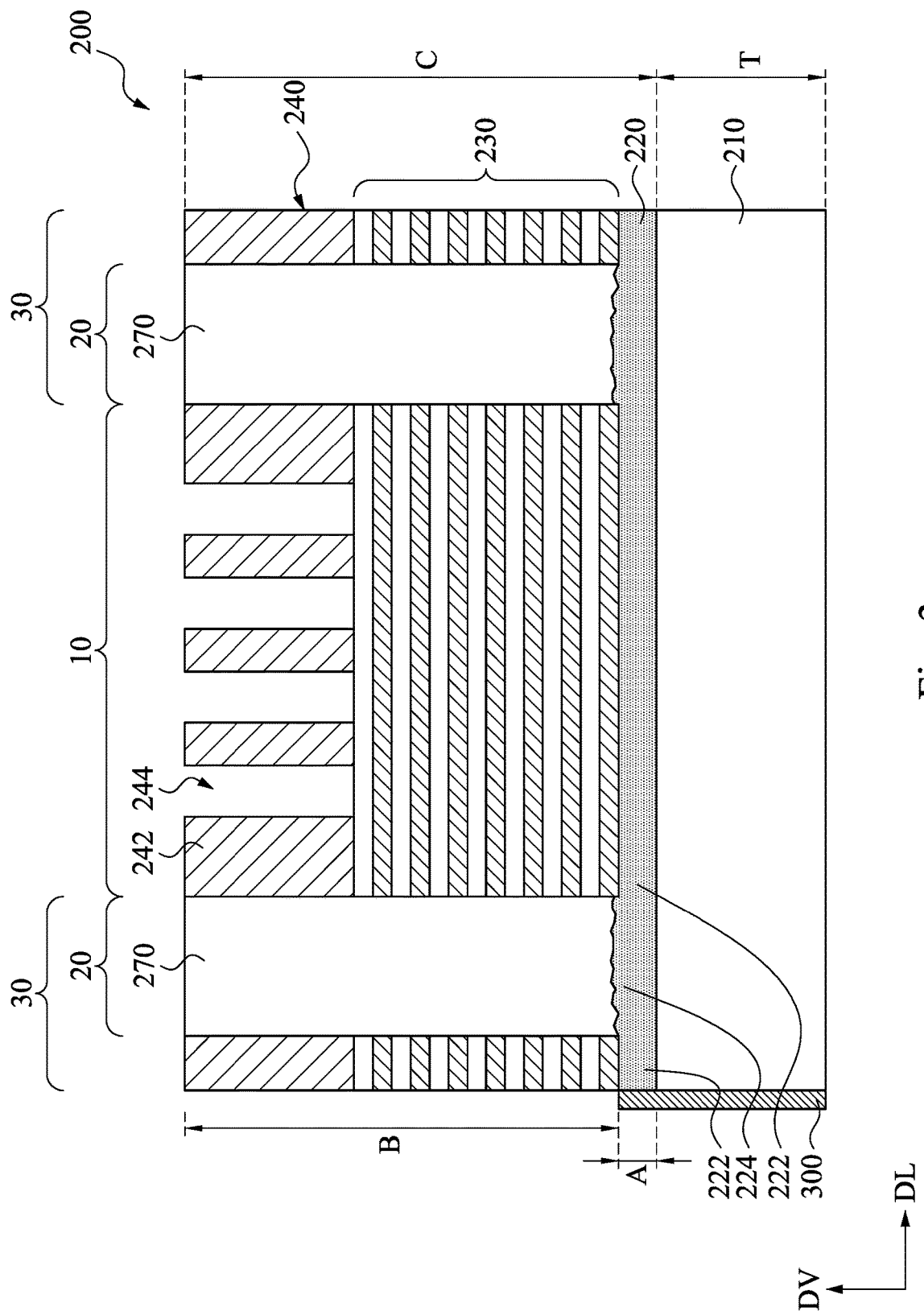
FIG. 3 is a cross-sectional view of the reflective mask of FIG. 2 taken along line 3 of FIG. 2.

Reference is made to FIG. 2 and FIG. 3, in which FIG. 3 is a cross-sectional view taken along line 3 of FIG. 2. The reflective mask 200 includes a substrate 210, a light absorbing layer 220 over the substrate 210, a reflective multilayer (ML) 230 over the light absorbing layer 220, and an absorption pattern 240 over the reflective ML 230. In some embodiments, the light absorbing layer 220 covers an entire top surface of the substrate 210. A portion of the reflective ML 230 at the black border zone 20 is removed to expose the light absorbing layer 220. That is, a portion of the light absorbing layer 220 is free from coverage by the reflective ML 230 to form the black border zone 20. The image zone 10 of the reflective mask 200 is surrounded by the black border zone 20. The absorption pattern 240 is formed over the reflective ML 230. The absorption pattern 240 includes a plurality of absorptive regions 242 over the reflective ML 230 and a plurality of spaces 244 between the absorptive regions 242 to expose the underlying reflective ML 230. In some embodiments, portions of the reflective ML 230 exposed by the spaces 244 between the absorptive regions 242 serve as reflective regions of the image zone 10.

The reflective ML 230 is configured to reflect EUV light. The absorptive regions 242 are configured to absorb EUV light. Therefore, the reflective mask 200 reflects a pattern of EUV light according to the pattern of the reflective regions of the image zone 10. At the black border zone 20, the reflective ML 230 is etched away and replaced with the light absorbing layer 220 and a filling material 270. The EUV reflectivity at the black border zone 20 is eliminated by the removal of the reflective ML 230 and the exposed light absorbing layer 220. The filling material 270 protects the light absorbing layer 220 thereunder, and also protects sidewalls of the reflective ML 230, from harsh manufacturing environments.

Referring again to the creation of EUV light by the radiation source 102 of FIG. 1, a carbon dioxide laser light is focused on fuel species such as tin droplets to generate laser produced plasma that emits EUV light. However, OoB light such as DUV light is also emitted by the ionized plasma as a byproduct, and a portion of this DUV light is inevitably reflected by the condenser optics 106 and reaches the reflective mask 200. The resist film 118 is also sensitive to this DUV light. Undesirably patterning light onto regions on the resist film 118 corresponding to edges between fields or dies on the wafer 116 results in an unwanted neighboring die effect. Therefore, in order to reduce the neighboring die effect, the black border zone 20 is configured to minimize reflection of EUV light and/or light with other wavelengths so as to not image a pattern onto the resist film 118. In some embodiments of the present disclosure, the light absorbing layer 220 is added at the black border zone 20 of the reflective mask 200, and is made of a material having a high absorbance and a low reflectance for DUV light and EUV light. The light absorbing layer 220 at the black border zone 20 is free from coverage by the reflective ML 230 for absorbing incident DUV light and EUV light during lithography, and preventing the same from undesirably being reflected to the resist film 118.

Reference is made to FIG. 3. In some embodiments, the light absorbing layer 220 includes a light-absorbing material, such as a black material, to absorb the EUV light and DUV light emitting onto the black border zone 20 of the reflective mask 200. In some embodiments, the high energy of the EUV light having a short wavelength is converted into heat. However, this heat at the absorptive regions 242 and the black border zone 20 can overheat the reflective mask 200 during lithography. Overheating may cause distortion and deformation of the reflective mask 200, which would lead to a distorted pattern imaged by the reflective mask 200 onto the resist film 118.

Therefore, in some embodiments, the light absorbing layer 220 is configured to convert the EUV light and/or light with other wavelengths into heat and is configured to transmit the heat. Furthermore, in some embodiments, the thermal conductivity of the light absorbing layer 220 is anisotropic (directionally dependent). For example, in some embodiments, the light absorbing layer 220 has a first thermal conductivity in lateral directions DL which are substantially parallel to a top surface of the substrate 210 and a second thermal conductivity in a vertical direction DV which is substantially perpendicular to the top surface of the substrate 210, and the first thermal conductivity of the light absorbing layer 220 is higher than the second thermal conductivity of the light absorbing layer 220. This anisotropic thermal conductivity of the light absorbing layer 220 allows the light absorbing layer 220 to absorb energy from the EUV light and/or light with other wavelengths and transmit the thermal energy in directions substantially parallel to the substrate 210 of the reflective mask 200, thereby reducing heating of the substrate 210 and preventing deformation of the reflective mask 200 during lithography. In some embodiments, the light absorbing layer 220 includes $sp^2$-hybrid carbon atoms. For example, the light absorbing layer 220 includes graphene, graphite, carbon nanotubes, or the like. The light absorbing layer 220 including graphene has a higher thermal conductivity along the plane of the graphene and a lower thermal conductivity in a direction normal to the plane of the graphene. In some embodiments, the plane of the graphene of the light absorbing layer 220 is substantially parallel to the lateral directions DL. The light absorbing layer 220 including carbon nanotubes has a higher thermal conductivity in the axial direction of the carbon nanotubes and a lower thermal conductivity in the radial direction of the carbon nanotubes. In some embodiments, the axial direction of the carbon nanotubes of the light absorbing layer 220 is substantially parallel to at least one of the lateral directions DL. In some embodiments, elements for dissipating heat through conduction, convection or radiation are arranged around the reflective mask 200.

In some embodiments, the light absorbing layer 220 is able to serve photoelectric conversion and is configured to convert the EUV light and/or light with other wavelengths into electricity. The energy of the EUV light and/or light with other wavelengths can be transmitted and dissipated in a form of the electricity, by the light absorbing layer 220. The light absorbing layer 220 includes an electrical conductor and is configured to transmit the electricity. The light absorbing layer 220 is electrically connected to and grounded by a grounding unit 300 so as to conduct the electricity converted from the EUV light and/or light with other wavelengths out of the reflective mask 200. The light absorbing layer 220 is able to convert the energy from the EUV light and/or light with other wavelengths into thermal and electrical energy, and transmit them out of the reflective mask 200 along the directions substantially parallel to the substrate 210. In some embodiments, the light absorbing layer 220 includes carbon nanotubes. In some embodiments, the carbon nanotubes included in the light absorbing layer 220 can be single walled nanotubes (SWNTs). The light absorbing layer 220 formed by SWNTs serves a photoelectric conversion function and is able to convert the EUV light and/or light with other wavelengths into electricity. In some embodiments, the grounding unit 300 is disposed on a sidewall of the substrate 210.

With insertion of the light absorbing layer 220, undesired photons can be captured and dissipated in the form of thermal and/or electrical energy. In some embodiments, the light absorbing layer 220 may also be configured to mitigate unwanted charges and/or heat accumulation at any portion of the reflective mask 200 including but not limited to the black border zone 20 and thus benefits the wafer printing quality. In some embodiments, the light absorbing layer 220 covers an entire top surface of the substrate 210.

Reference is made to FIGS. 2 and 3. The light absorbing layer 220 has first portions 222 disposed under and covered by the reflective ML 230. The light absorbing layer 220 has a second portion 224 that is free from coverage by the reflective ML 230. In some embodiments, the filling material 270 is in the reflective ML 230, at the black border zone 20, and over the second portion 224 of the light absorbing layer 220. The second portion 224 of the light absorbing layer 220 is interposed between the filling material 270 and the substrate 210. The filling material 270 can be a spin-on-glass (SOG) filling material or the like. The filling material 270 protects the second portion 224 of the light absorbing layer 220, and also protects the sidewalls of the reflective ML 230 from harsh manufacturing environments. A top surface of the filling material 270 has a rectangular frame shape, and a top surface of the second portion 224 of the light absorbing layer 220 also has a rectangular frame shape. The first portions 222 of the light absorbing layer 220 and the reflective ML 230 thereon are arranged at the image zone 10 and the frame zone 30 of the reflective mask 200. The second portion 224 of the light absorbing layer 220 is arranged at the black border zone 20 of the reflective mask 200.

The reflective ML 230 and the absorption pattern 240 together have a thickness B greater than about 300 nm, such that sufficient reflectivity of EUV light is achieved by using a sufficient number of film pairs. An overall thickness C of the structure disposed over the substrate 210 is substantially equal to or greater than the sum of a thickness A of the light absorbing layer 220, and the thickness B of the reflective ML 230 and the absorption pattern 240. The thickness A of the light absorbing layer 220 is less than a thickness T of the substrate 210, to preserve material cost and prevent unstable structural integrity.

In some embodiments, the second portion 224 of the light absorbing layer 220 has been treated by, for example, bombardment, oxidation, or the like to increase the roughness of the second portion 224 of the light absorbing layer 220, such that EUV light reflectivity and OoB light reflectivity such as DUV light reflectivity of the second portion 224 of the light absorbing layer 220 can be lowered. As a result, the roughness of the second portion 224 of the light absorbing layer 220 is higher than the roughness of the first portions 222 of the light absorbing layer 220.

Figure 4:
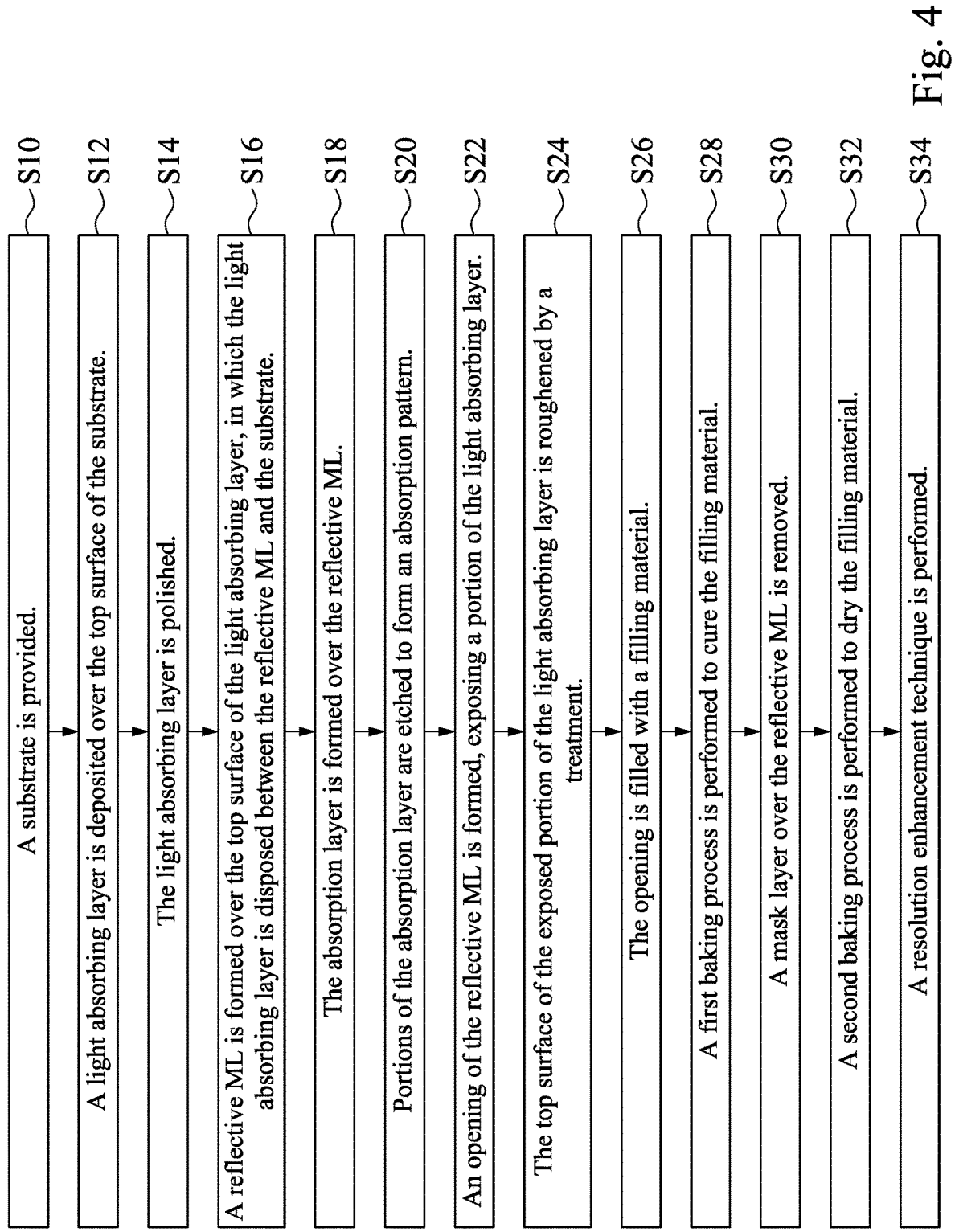
FIG. 4 is a flowchart of a method for fabricating the reflective mask, according to some embodiments of the present disclosure.
Figure 5:
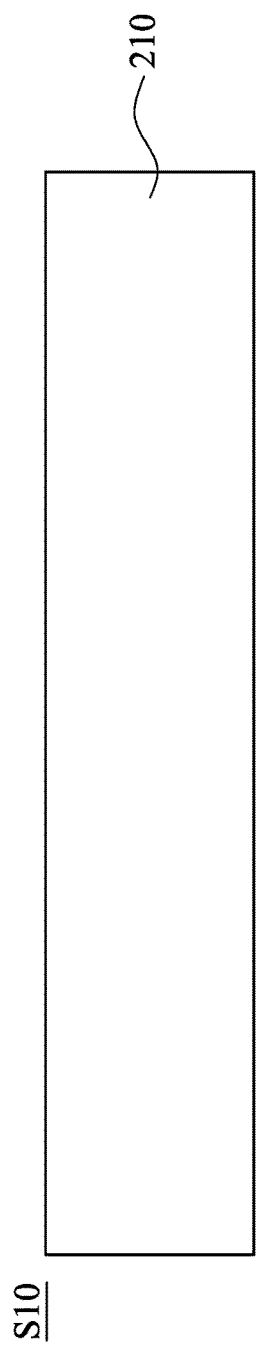
FIG. 5 to FIG. 7 and FIG. 9 to FIG. 18 are cross-sectional views of different steps of a method of fabricating the reflective mask of FIG. 3, according to some embodiments of the present disclosure.

Reference is made to FIG. 4, which is a flowchart of a method of fabricating the reflective mask of FIG. 3 according to some embodiments of the present disclosure, and to FIGS. 5-18, which are cross-sectional views of different steps of the method. As shown in FIG. 5, the method begins at step S10 by providing the substrate 210. The substrate 210 may include a substrate made of a low thermal expansion material (LTEM), fused silica, or the like. The LTEM material may include $TiO_2$ doped $SiO_2$ and/or other suitable materials. The LTEM substrate 210 serves to minimize image distortion due to mask heating. In some embodiments, the LTEM substrate 210 includes materials with a low defect level and a smooth surface.

Figure 6:
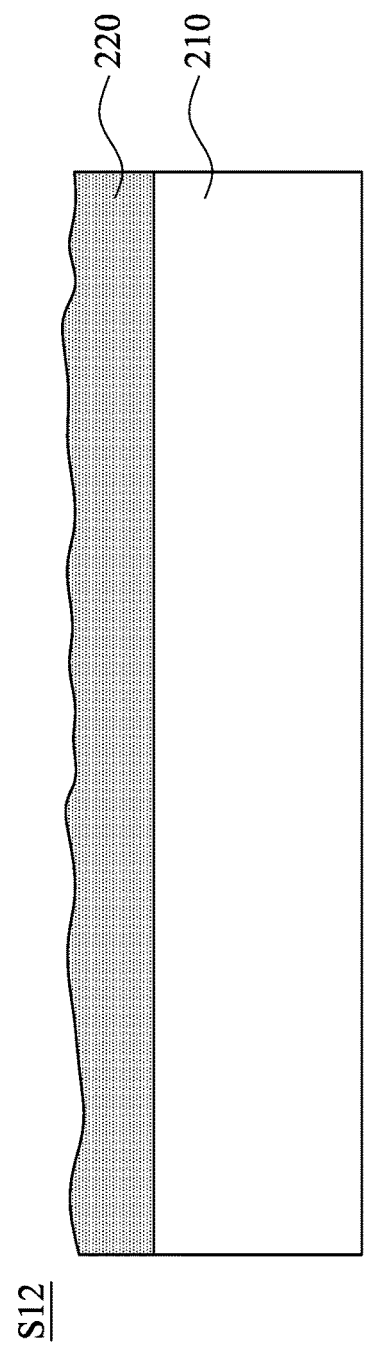

Reference is made to FIG. 4 and FIG. 6. In step S12, a light absorbing layer 220 is deposited over the top surface of the substrate 210. In some embodiments, the light absorbing layer 220 has high absorbance and low reflectance for EUV light and light of OoB wavelength such as DUV light. In some embodiments, the light absorbing layer 220 includes sp²-hybrid carbon atoms. For example, the light absorbing layer 220 includes graphene, graphite, carbon nanotubes, or the like.

Figure 7:

Reference is made to FIG. 4 and FIG. 7. In step S14, in some embodiments, the light absorbing layer 220 is optionally polished to have a fine and uniform top surface. The step of polishing light absorbing layer 220 is either included or omitted depending on the light absorbing layer 220 formation process and result. For example, if the light absorbing layer 220 includes graphene with sp²-hybrid carbon atoms and naturally has a flat and uniform top surface, then the step of polishing light absorbing layer 220 can be omitted.

Figure 8A:
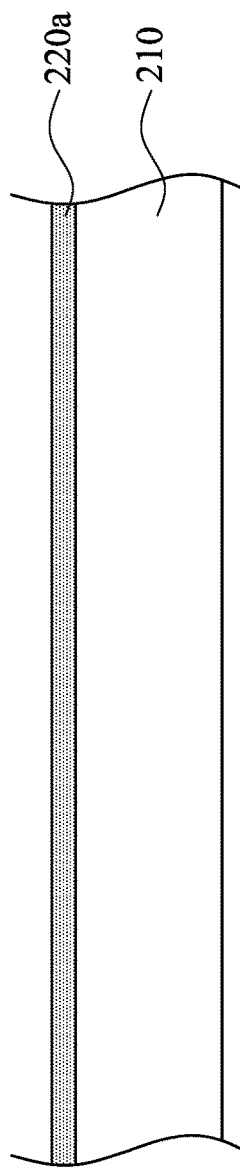
FIGS. 8A, 8B, and 8C are partial views of the light absorbing layer of FIG. 6, according to some embodiments of the present disclosure.
Figure 8B:
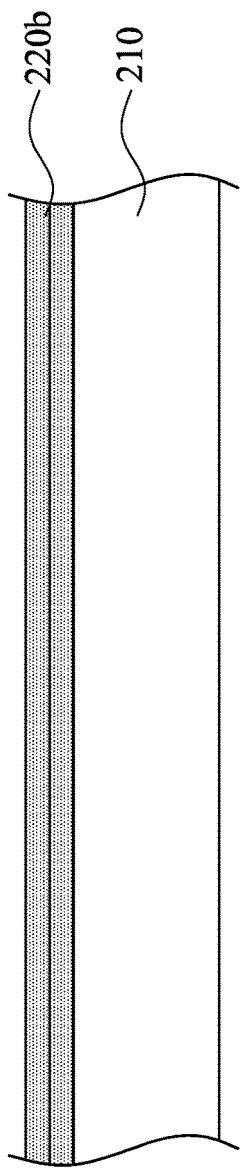

FIGS. 8A and 8B are partial views of the light absorbing layer 220 of FIG. 7, according to some embodiments of the present disclosure. In some embodiments, the light absorbing layer 220a includes graphene (as shown in FIG. 8A). In some embodiments, the light absorbing layer 220b includes graphite or stacked layers of graphene (as shown in FIG. 8B). Graphene has high absorbance and low reflectance for EUV light and OoB light such as DUV light. In some embodiments, the light absorbing layer 220a/220b has a reflectance of less than about 3% for DUV light, such that a limited amount of light is reflected to the photoresist layer, thereby reducing the neighboring die effect. Moreover, graphene has a greater thermal conductivity along the plane of the graphene, and a smaller thermal conductivity in a direction normal to the plane of the graphene. The graphene can be grown such that the plane of the graphene is substantially parallel to the top surface of the light absorbing layer 220a/220b. The light absorbing layer 220a/220b made of graphene has a higher thermal conductivity along its top surface and a lower thermal conductivity in a direction normal to its top surface. Therefore, the energy of the EUV light and the OoB light such as the DUV light emitting to the black border zone 20 of the reflective mask 200 (as shown in FIG. 2) is absorbed by the light absorbing layer 220a/220b and transmitted towards the sides of the reflective mask 200, and not toward the substrate 210, thereby limiting the overheating of the substrate 210.

Figure 8C:
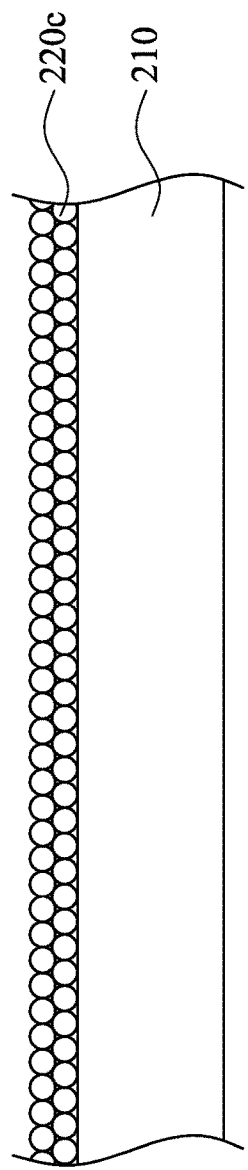

FIG. 8C is a partial view of the light absorbing layer 220 of FIG. 7, according to some embodiments of the disclosure. In some embodiments, the light absorbing layer 220c includes carbon nanotubes. Carbon nanotubes are carbon molecules having cylindrical nanostructures, or rolled sheets of graphene. In some embodiments, the carbon nanotubes included in the light absorbing layer 220c can be SWNTs having long and hollow structures with the walls formed by one-atom-thick sheets of carbon. When EUV light and OoB light such as DUV light reach the black border zone 20 (as shown in FIG. 2), the carbon nanotubes included in the light absorbing layer 220c and exposed at the black border zone 20 (as shown in FIG. 2) absorb the EUV light and the OoB light such as the DUV light. In some embodiments, the light absorbing layer 220c has a reflectance of less than about 3% for DUV light, such that a limited amount of light is reflected to the photoresist layer, thereby reducing the neighboring die effect. In some embodiments, the light absorbing layer 220c formed by SWNTs serves a photoelectric conversion function and is able to convert the EUV light and the OoB light such as the DUV light into electrical energy. Namely, the light absorbing layer 220c formed by SWNTs can form p-n junction diodes and is able to convert photon energy to electrical energy directly. Moreover, the carbon nanotubes can be arranged such that the axial direction of the carbon nanotubes is substantially parallel to the top surface of the substrate 210. In some embodiments, a carbon nanotube of the light absorbing layer 220c can have a thermal conductivity greater than about 3000 $W·m^{-1}·K^{-1}$ in its axial direction, and a thermal conductivity less than about 3 $W·m^{-1}·K^{-1}$ in its radial direction. Therefore, the energy of the EUV light and the OoB light such as the DUV light tends to be absorbed by the carbon nanotubes and transmitted towards the sides of the reflective mask 200, and not toward the substrate 210, thereby limiting the heating of the substrate 210. Furthermore, in some embodiments, the ratio of the thermal conductivity in the axial direction of the carbon nanotube to the thermal conductivity in the radial direction of the carbon nanotube can be increased by increasing the aspect ratio (i.e. length to diameter ratio) of the carbon nanotube.

Figure 9:
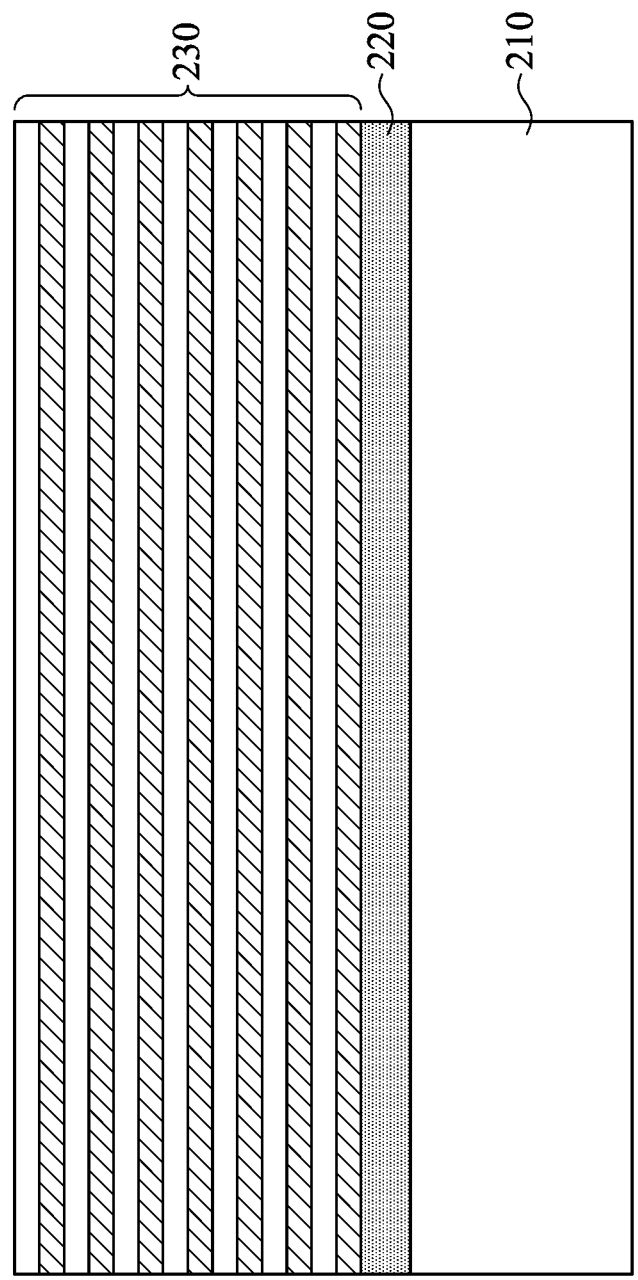

Reference is made to FIG. 4 and FIG. 9. Step S16 includes forming the reflective ML 230 over the top surface of the light absorbing layer 220, in which the light absorbing layer 220 is disposed between the reflective ML 230 and the substrate 210. According to Fresnel equations, light reflection will occur when light propagates across the interface between two materials of different refractive indices. The reflective ML 230 includes alternating films of materials having different refractive indexes. The reflected light is larger when the difference of refractive indices is larger. When EUV light reaches a surface of the topmost film of the reflective ML 230, or an interface between any two films of the reflective ML 230, a portion of the EUV light is reflected.

In order to increase the total amount of reflected EUV light, a total number of films included in the reflective ML 230 can be increased. In some embodiments, the films of materials in the reflective ML 230 have alternating indexes. In other words, high refractive films having a higher refractive index are arranged at every other film, and low refractive films having a lower refractive index are arranged at every other film. EUV light are reflected at low-to-high index interfaces, and at high-to-low index interfaces. The thicknesses of the films are chosen such that reflections at different interfaces constructively interfere with each other, for the angle of incident EUV light at which the reflective ML 230 is intended to operate. For example, the thicknesses of individual films are chosen such that the path-length differences for reflections from different high-to-low index interfaces are integer multiples of the wavelength of the EUV light. On the other hand, each of the path lengths of reflections from the low-to-high index interfaces differ from each of the path lengths of reflections from the high-to-low index interfaces by an integer multiple of half a wavelength of the EUV light. Since the EUV light is inverted (phase shifts 180 degrees) when reflected at the low-to-high index interfaces, but not when reflected at the high-to-low index interfaces, these reflections are also in phase and constructively interfere.

In some embodiments, the reflective ML 230 includes a plurality of film pairs, for example, molybdenum-silicon (Mo/Si) film pairs (e.g., a layer of molybdenum above or below a layer of silicon in each film pair). The thickness of each film of the reflective ML 230 depends on the EUV wavelength and the incident angle. The thickness and the film pairs of the ML 230 can be adjusted to achieve a maximum constructive interference of the EUV light reflected at each interface and a minimum absorption of the EUV light by the reflective ML 230. The reflective ML 230 may be selected such that it provides a high reflectivity to a selected radiation type/wavelength.

In some embodiments, a buffer layer is optionally formed over the reflective ML 230. The buffer layer serves as an etching stop layer in a subsequent patterning or a repairing process of an absorption layer, which will be described in detail later. The buffer layer has different etching characteristics from the absorption layer. The buffer layer includes ruthenium (Ru), Ru compounds such as RuB and RuSi, or the like. A low temperature deposition process is often chosen for the buffer layer to prevent inter-diffusion of the reflective ML 230.

Figure 10:
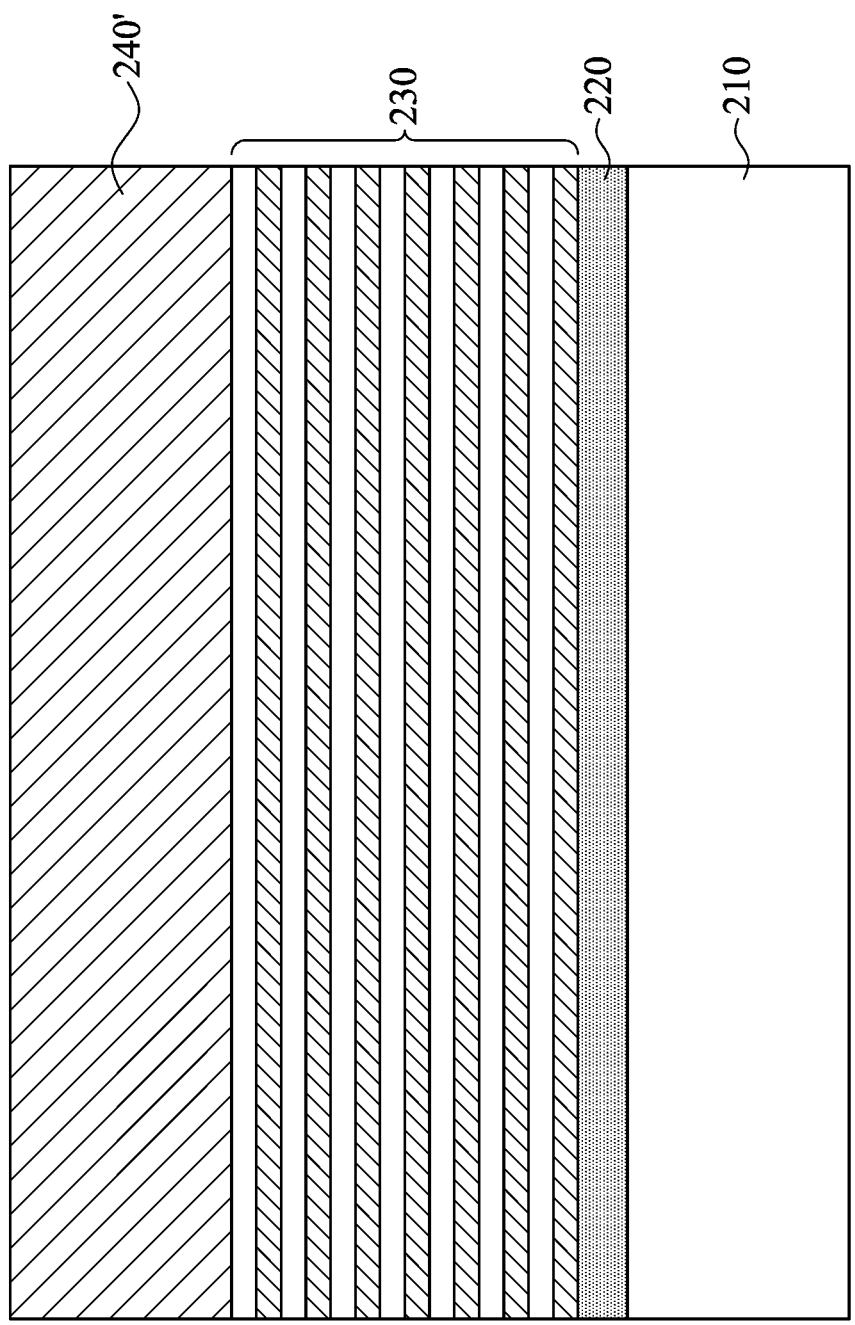

Reference is made to FIG. 4 and FIG. 10. Step S18 includes forming the absorption layer 240' over the reflective ML 230 or the buffer layer in some embodiments. The absorption layer 240' absorbs radiation in the EUV wavelength range projected onto the reflective mask 200. The absorption layer 240' includes a single layer or multiple layers from a group of chromium, chromium oxide, titanium nitride, tantalum nitride, tantalum, titanium, or aluminum-copper, palladium, tantalum boron nitride, aluminum oxide, molybdenum, or other suitable materials. With a proper configuration of film layers, the absorption layer 240' will provide process flexibility in a subsequent etching process by having different etch characteristic from the underlying layer, such as the reflective ML 230 and the buffer layer.

Figure 11:
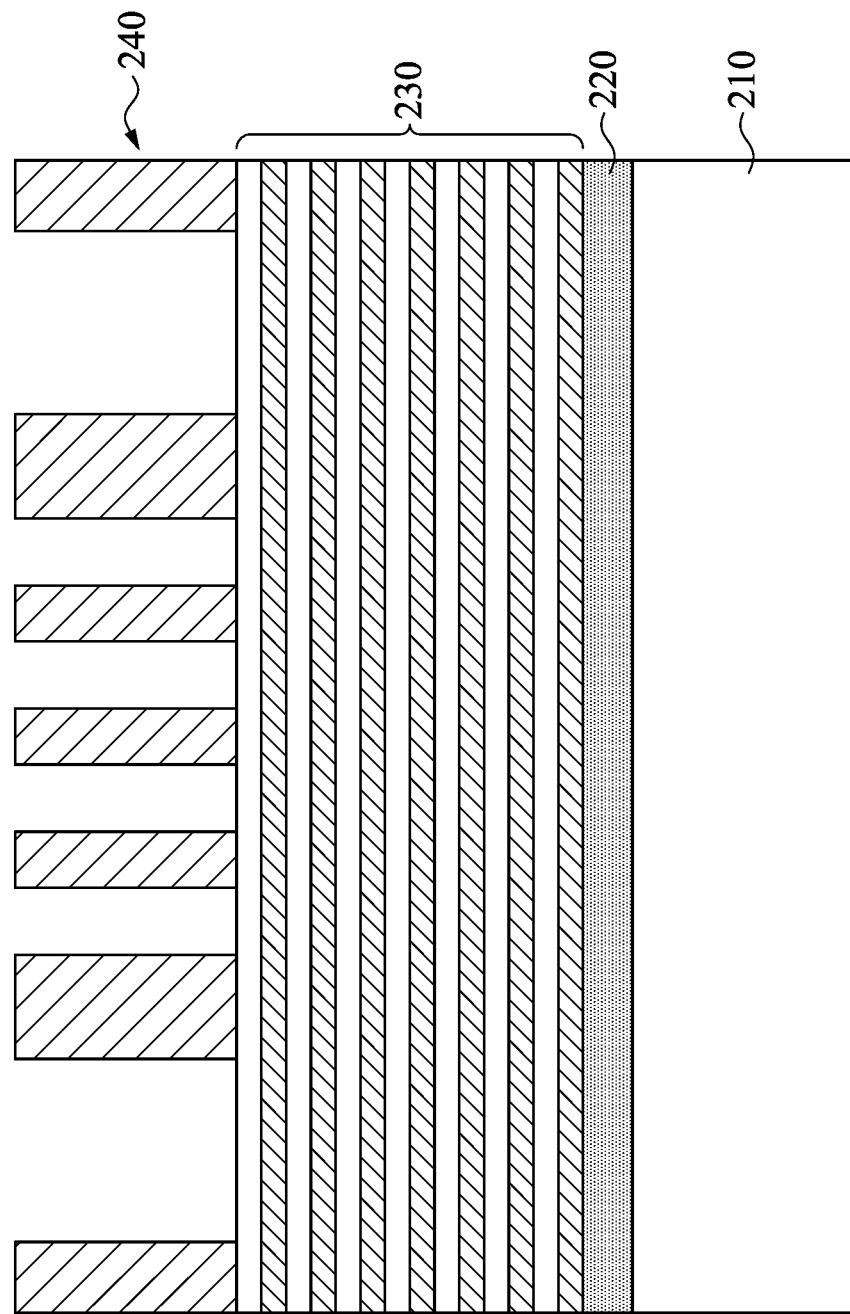

Reference is made to FIG. 4 and FIG. 11. Step S20 includes etching portions of the absorption layer 240' to form an absorption pattern 240 over the reflective ML 230. The patterning process includes resist coating (e.g., spin-on coating), soft baking, target aligning, exposure, post-exposure baking, developing the resist, rinsing, drying (e.g., hard baking), other suitable processes, and/or combinations thereof. Alternatively, the photolithography exposing process is implemented or replaced by other proper methods such as maskless photolithography, electron-beam writing, direct-writing, and/or ion-beam writing.

Next, an etching process is followed to remove portions of the absorption layer 240' to form the absorption pattern 240. With the patterned resist layer serves as an etch mask, the underlying layer (e.g. the absorption layer 240') is etched through the openings of the patterned resist layer while the portion of the underlying layer covered by the resist layer remains. The etching process may include dry (plasma) etching, wet etching, and/or other etching methods. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. After the etching process, the patterned resist layer may be removed by a suitable technique, such as stripping or ashing.

Figure 12:
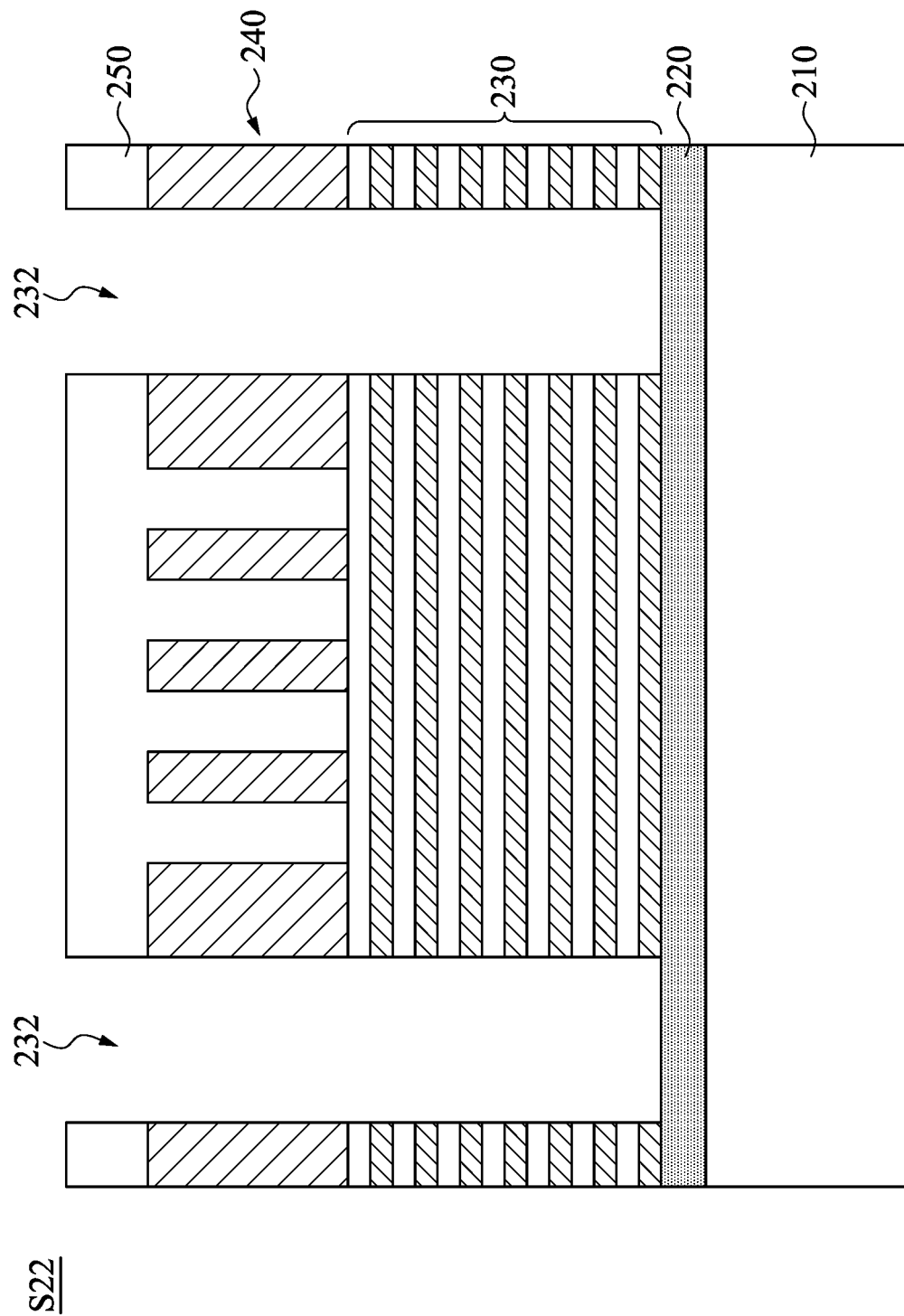

Reference is made to FIG. 4 and FIG. 12. In step S22, the opening 232 is formed at the black border zone 20 of the reflective mask 200 (as shown in FIG. 2). The opening 232 extends through the absorption pattern 240 and the reflective ML 230 to expose a portion of the light absorbing layer 220. The opening 232 may be formed by performing one or more suitable etching processes, such as forming a mask layer 250 over the absorption pattern 240 and the reflective ML 230, patterning the mask layer 250, and performing plural etching processes on the absorption pattern 240 and the reflective ML 230 using the patterned mask layer 250 as an etch mask. The etching process performed on the absorption pattern 240 can be similar as that discussed in FIG. 11. The patterned mask layer 250 remains over the absorption pattern 240 and the reflective ML 230 after the light absorbing layer 220 is exposed.

Figure 13:
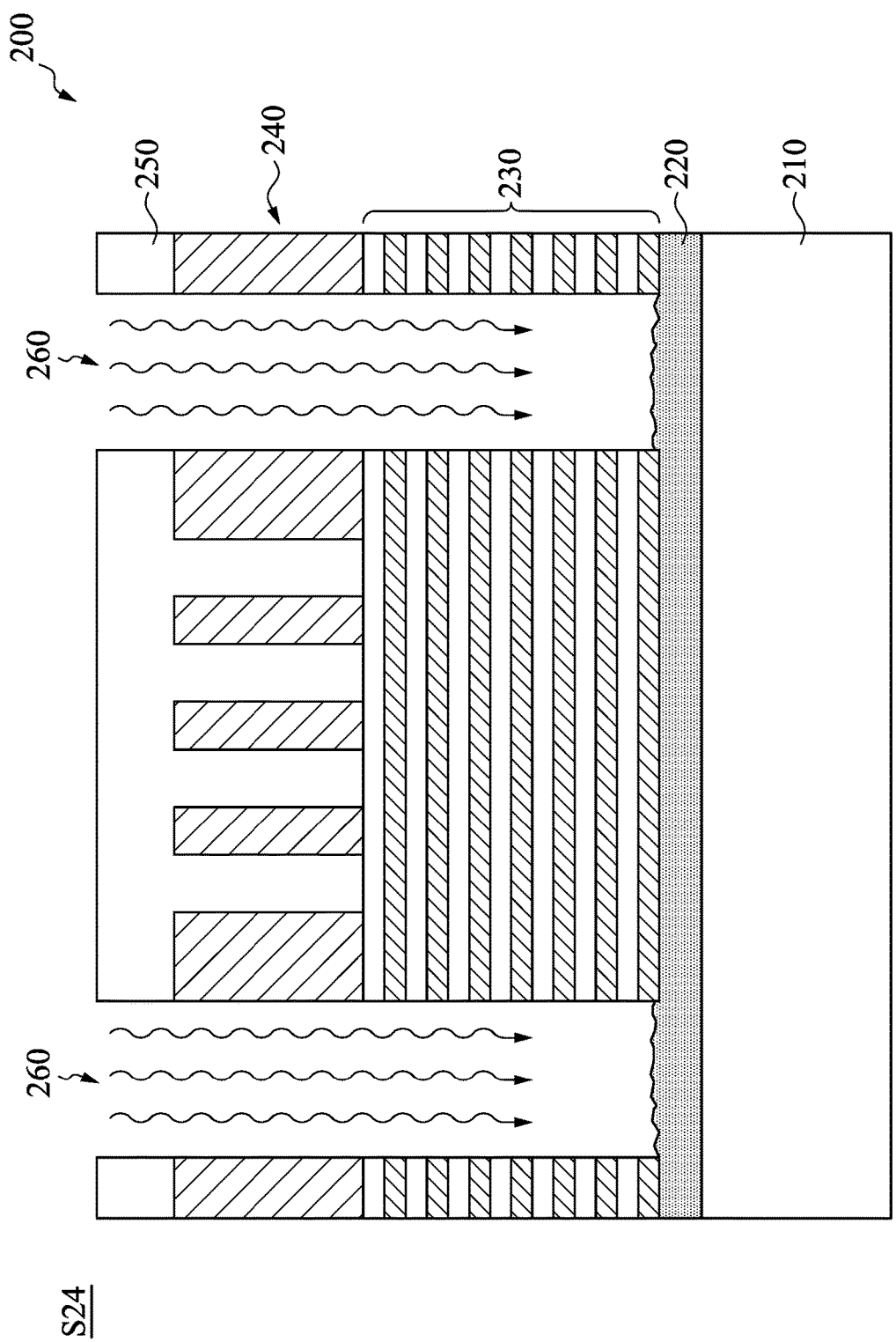

Reference is made to FIG. 4 and FIG. 13. In some embodiments, the method further includes step S24, in which the top surface of the exposed portion of the light absorbing layer 220 is roughened by a treatment 260 such as oxidation, bombardment, or the like. A greater roughness of the top surface of the exposed portion of the light absorbing layer 220 results in a lower reflection of the EUV light and/or the OoB light such as the DUV light by the exposed portion of the light absorbing layer 220 at the black border zone 20 of the reflective mask 200. The mask layer 250 protects the underlying absorption pattern 240 and the reflective ML 230 from being damaged by the treatment 260.

Figure 14:
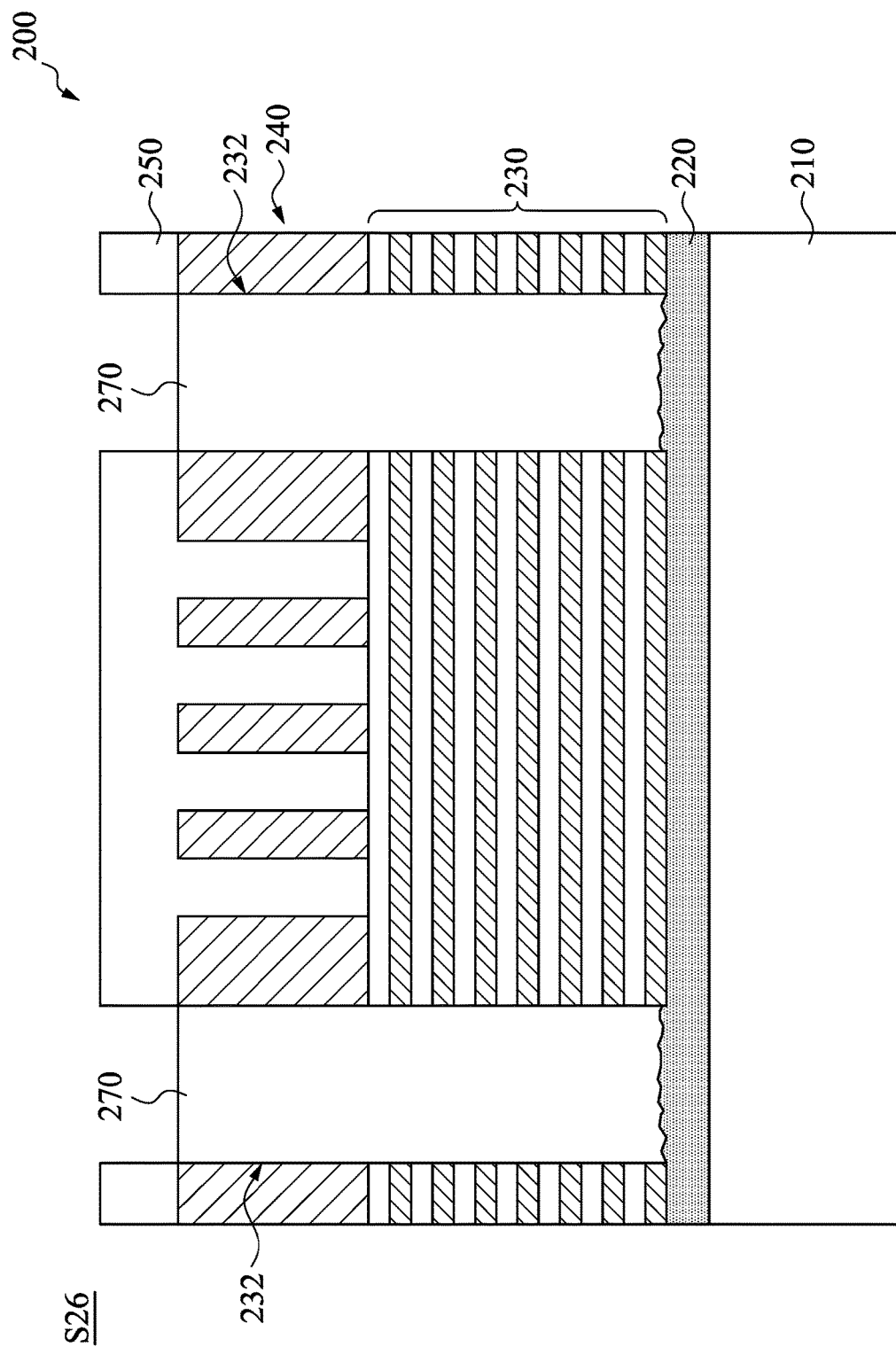

Reference is made to FIG. 4 and FIG. 14. In step S26, the opening 232 is filled with a filling material 270. The filling material 270 covers the exposed portion of the light absorbing layer 220. In some embodiments, the filling material 270 is a transparent, flowable, and low thermal expansion material. For example, the filling material 270 can be a spin-on-glass (SOG) filling material or the like. The filling material 270 is dispensed in the opening 232. The filling material 270 protects the light absorbing layer 220 thereunder, and also protects the sidewalls of the reflective ML 230, from harsh manufacturing environments in subsequent steps.

Figure 15:
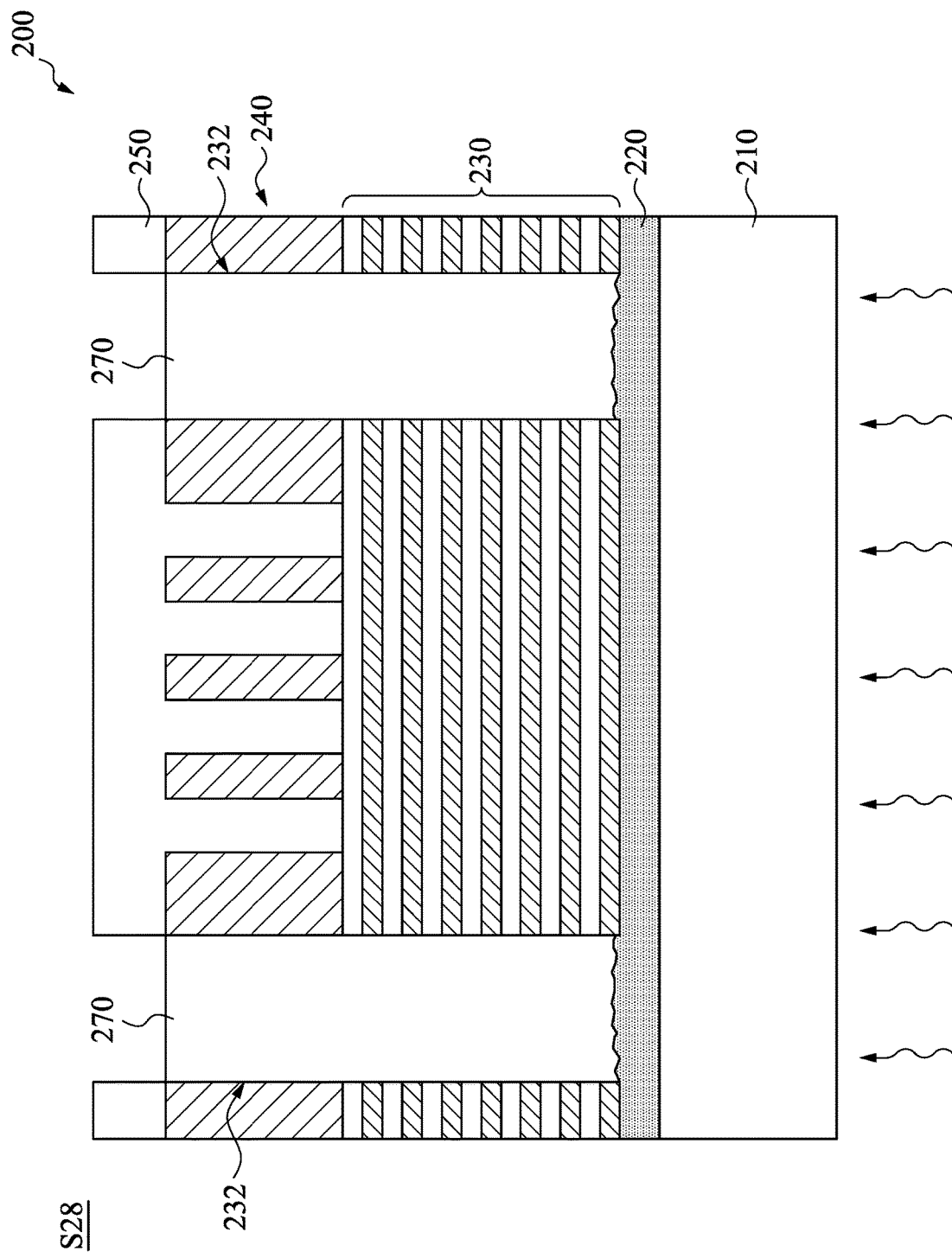

Reference is made to FIG. 4 and FIG. 15. In step S28, a first baking process is performed to cure the filling material 270. After the first baking process, a solvent of the filling material 270 is removed, and the filling material 270 becomes solid. The top surface of the filling material 270 is higher than the topmost surface of the reflective ML 230 to protect the entire sidewalls of the reflective ML 230. In some embodiments, the top surface of the filling material 270 is substantially coplanar with the top surface of the absorption pattern 240. In some other embodiments, the top surface of the filling material is lower than or higher than the top surface of the absorption pattern.

Figure 16:
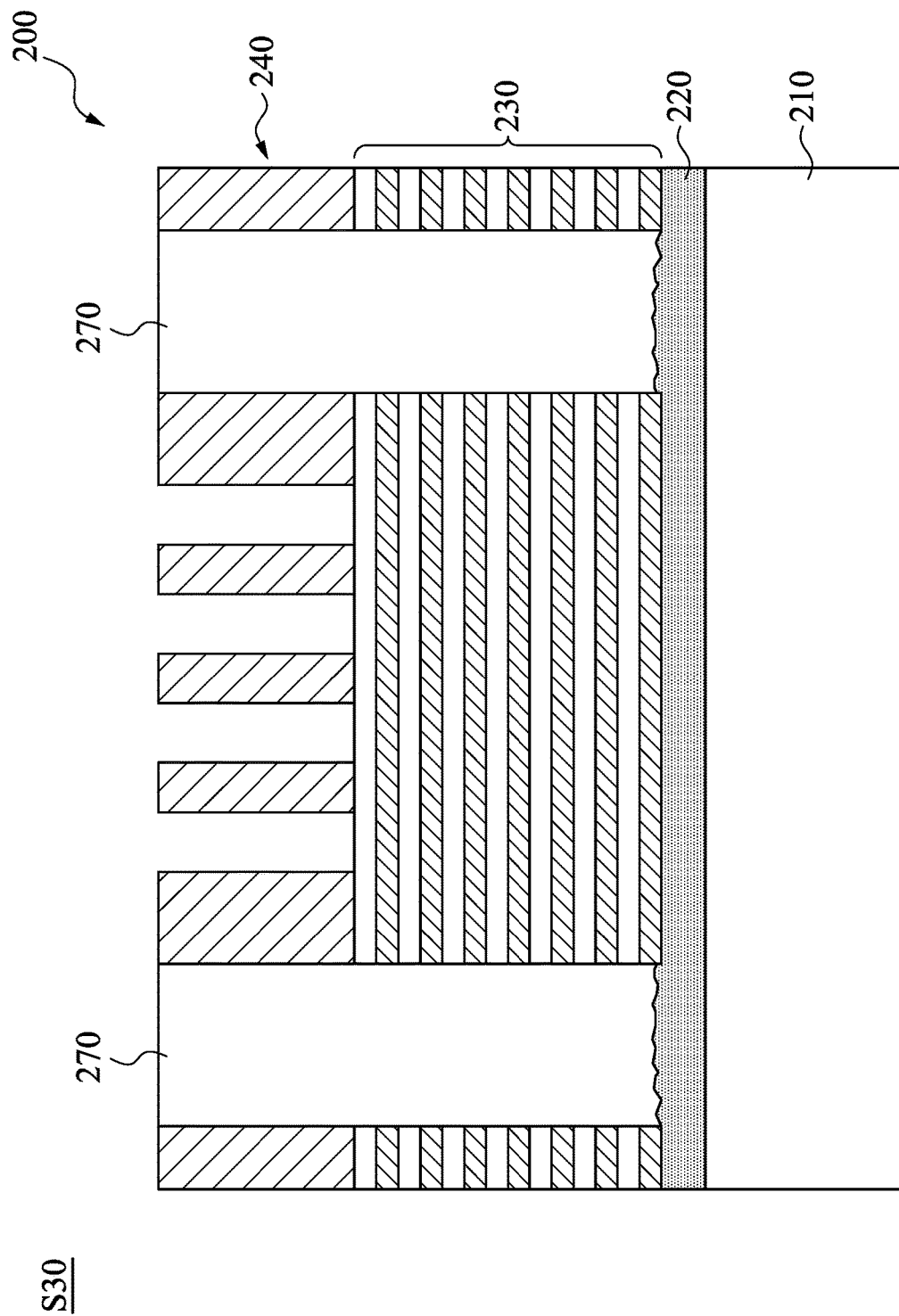

Reference is made to FIG. 4 and FIG. 16. In step S30, the mask layer 250 (see FIG. 15) is removed. The mask layer 250 may be removed by a suitable technique, such as stripping, ashing, dry etching, wet etching or multiple etching processes including both wet etching and dry etching, depending on the material compatibility and desired pattern profile.

Figure 17:
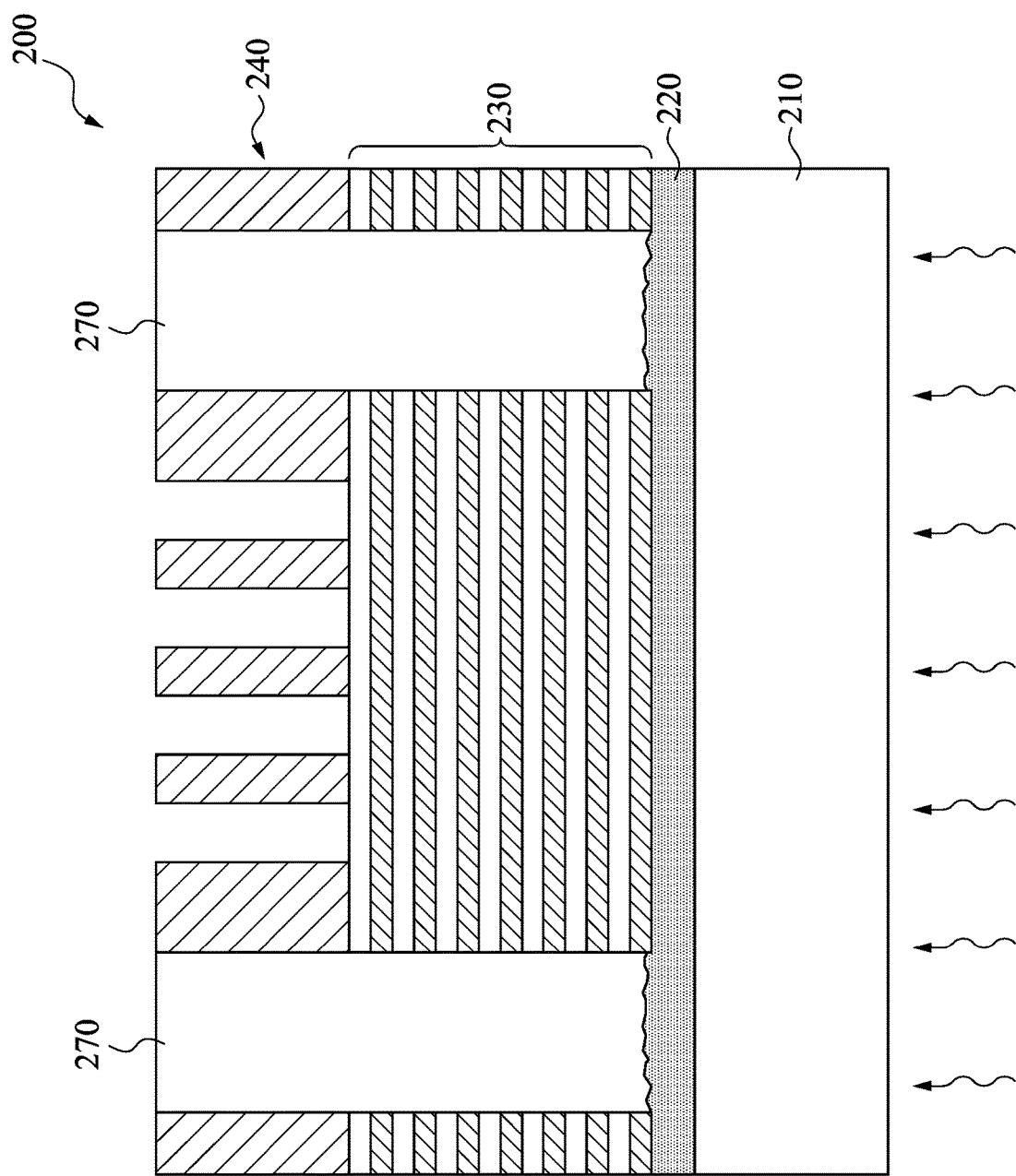

Reference is made to FIG. 4 and FIG. 17. In step S32, a second baking process is performed to dry the filling material 270, and thus the filling material 270 becomes denser after the second baking process.

Figure 18:
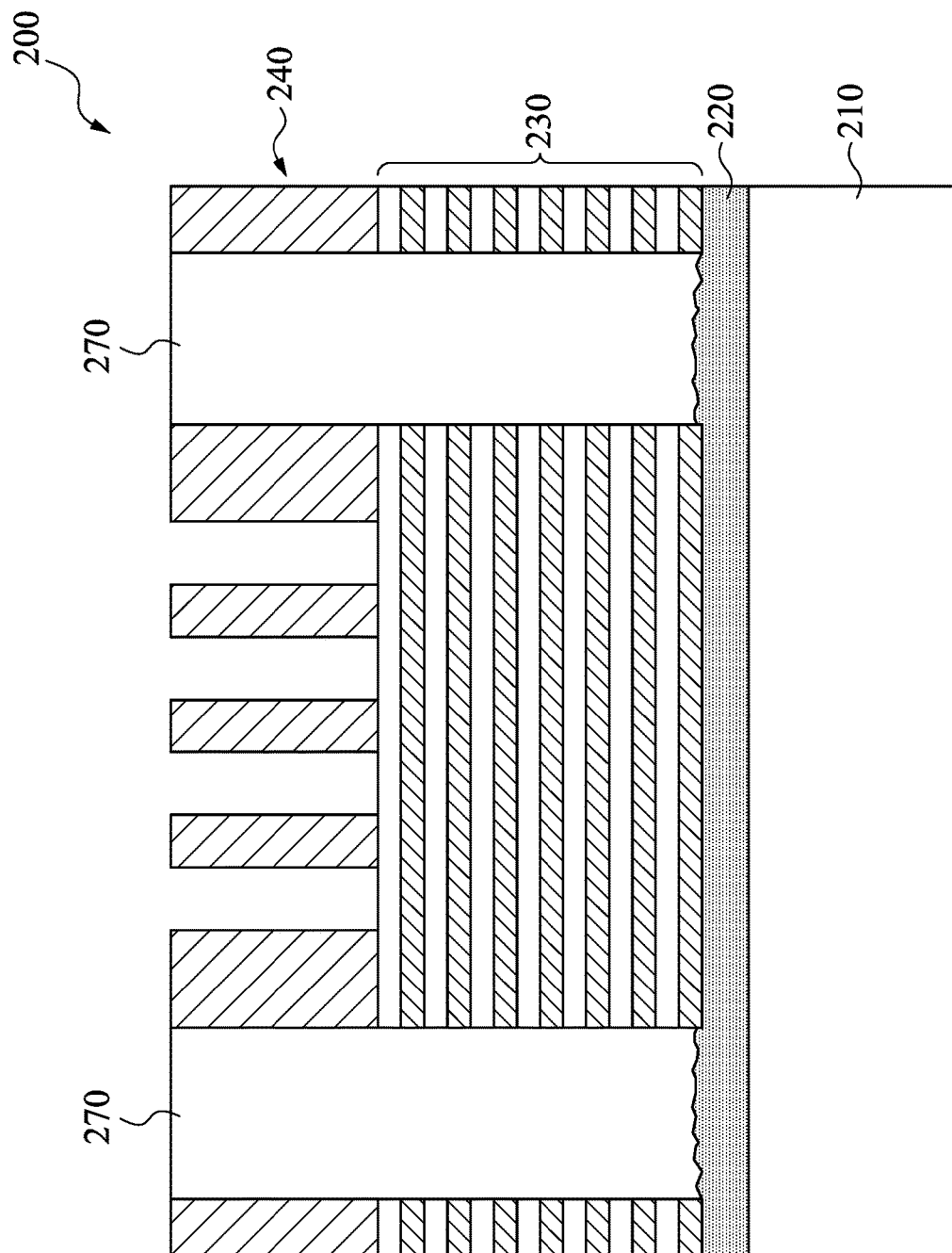

Reference is made to FIG. 4 and FIG. 18. After above processes, the reflective mask 200 is obtained. In step S34, other resolution enhancement techniques such as an optical proximity correction (OPC) may be performed. The reflective mask 200 may undergo a defect repair process using a mask repair system. The mask repair system includes a suitable system, such as an e-beam repair system and/or a focused ion beam (FIB) repair system.

Figure 19:
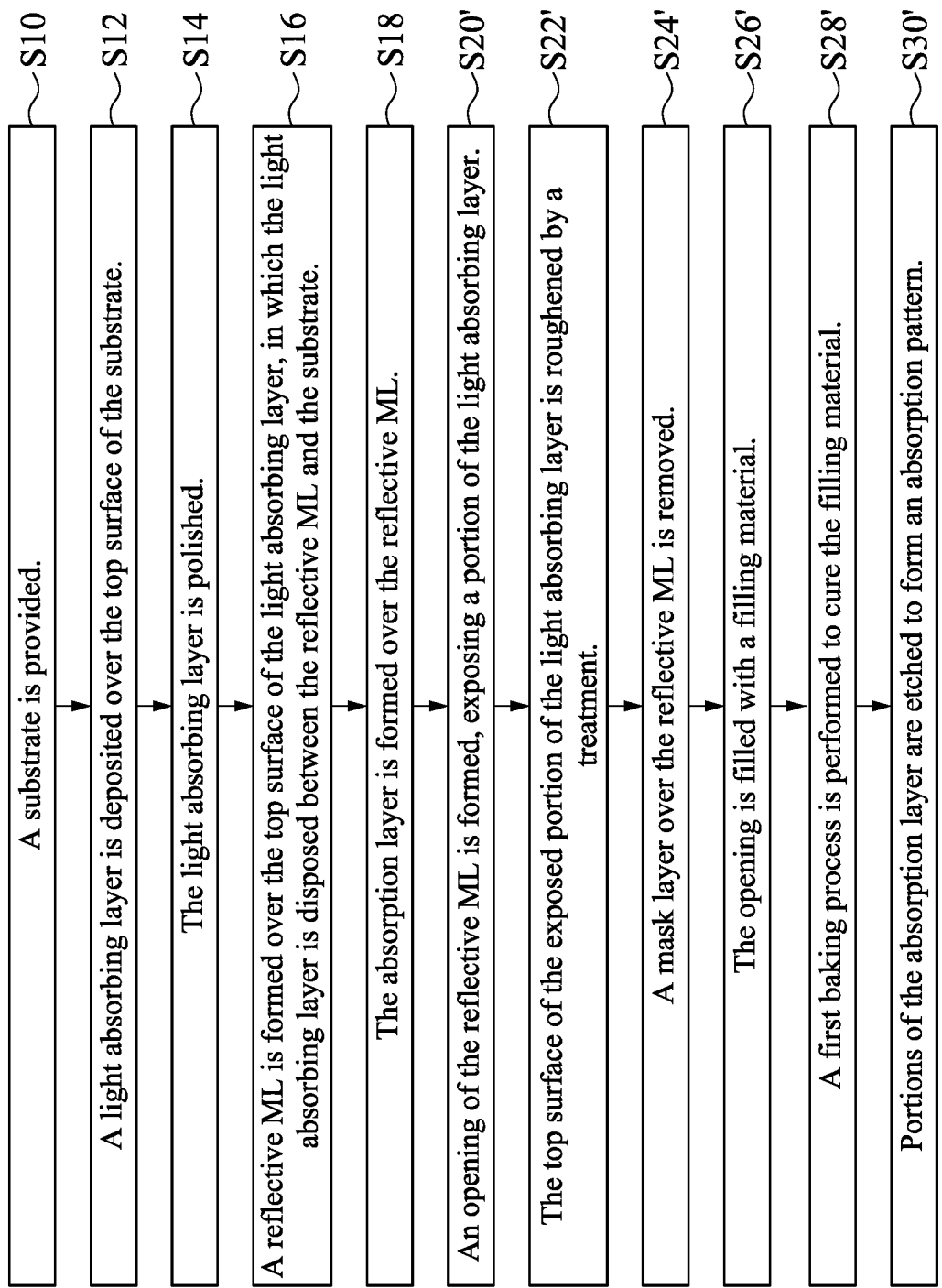
FIG. 19 is a flowchart of another method for fabricating the reflective mask, according to some embodiments of the present disclosure.
Figure 20:
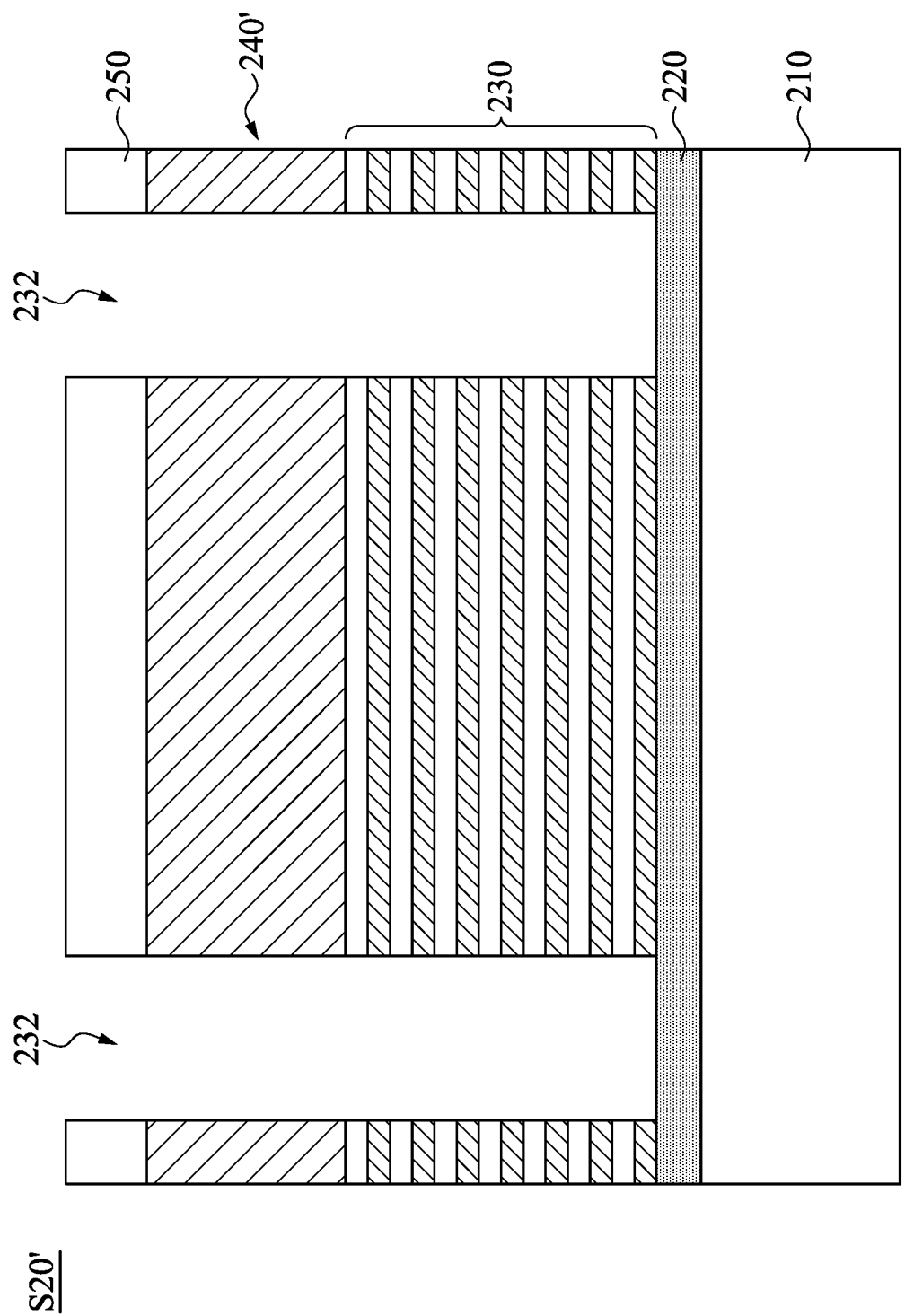
FIG. 20 to FIG. 25 are cross-sectional views of different steps of another method of fabricating the reflective mask of FIG. 3, according to some embodiments of the present disclosure.
Figure 21:
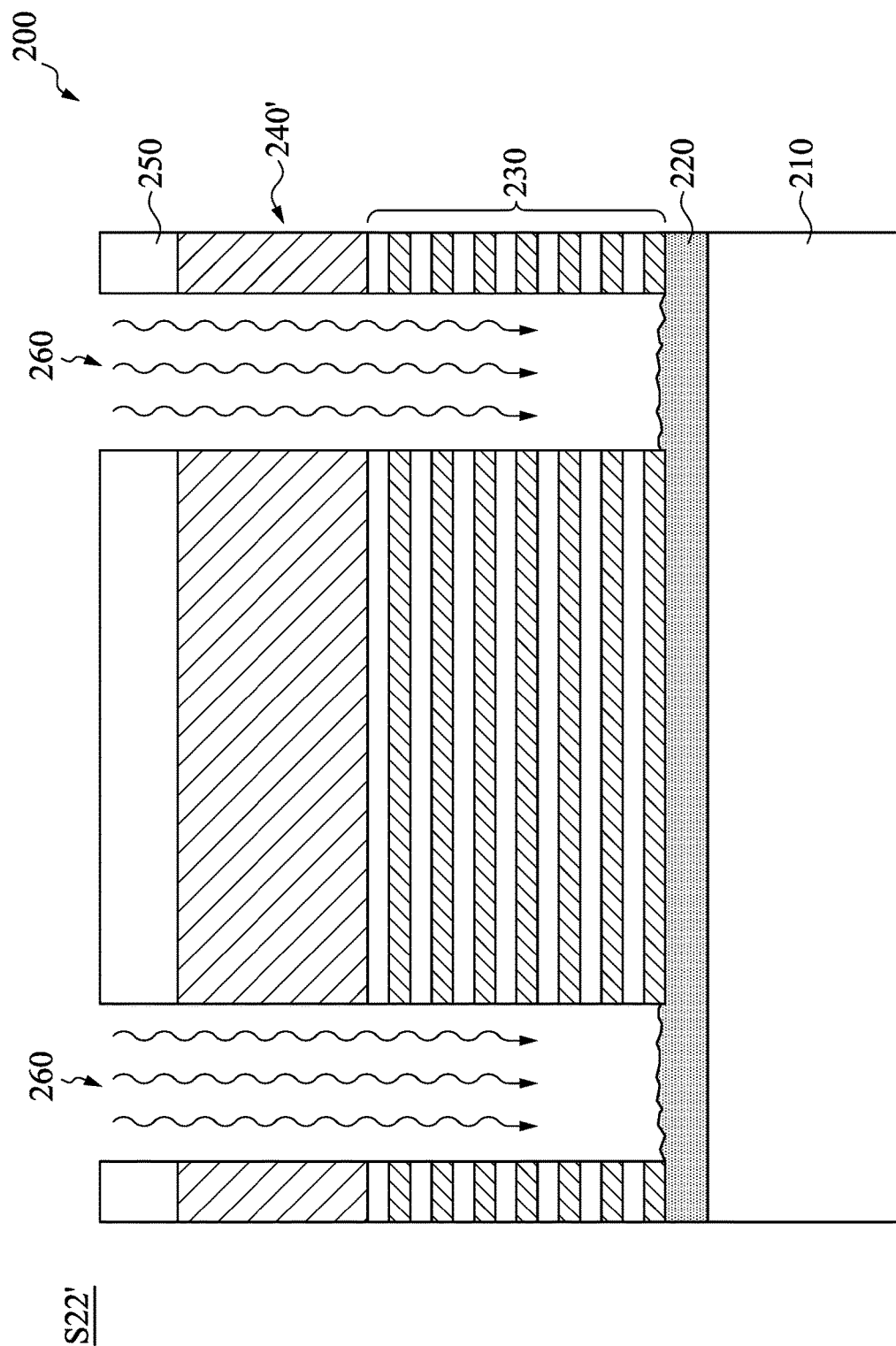
Figure 22:
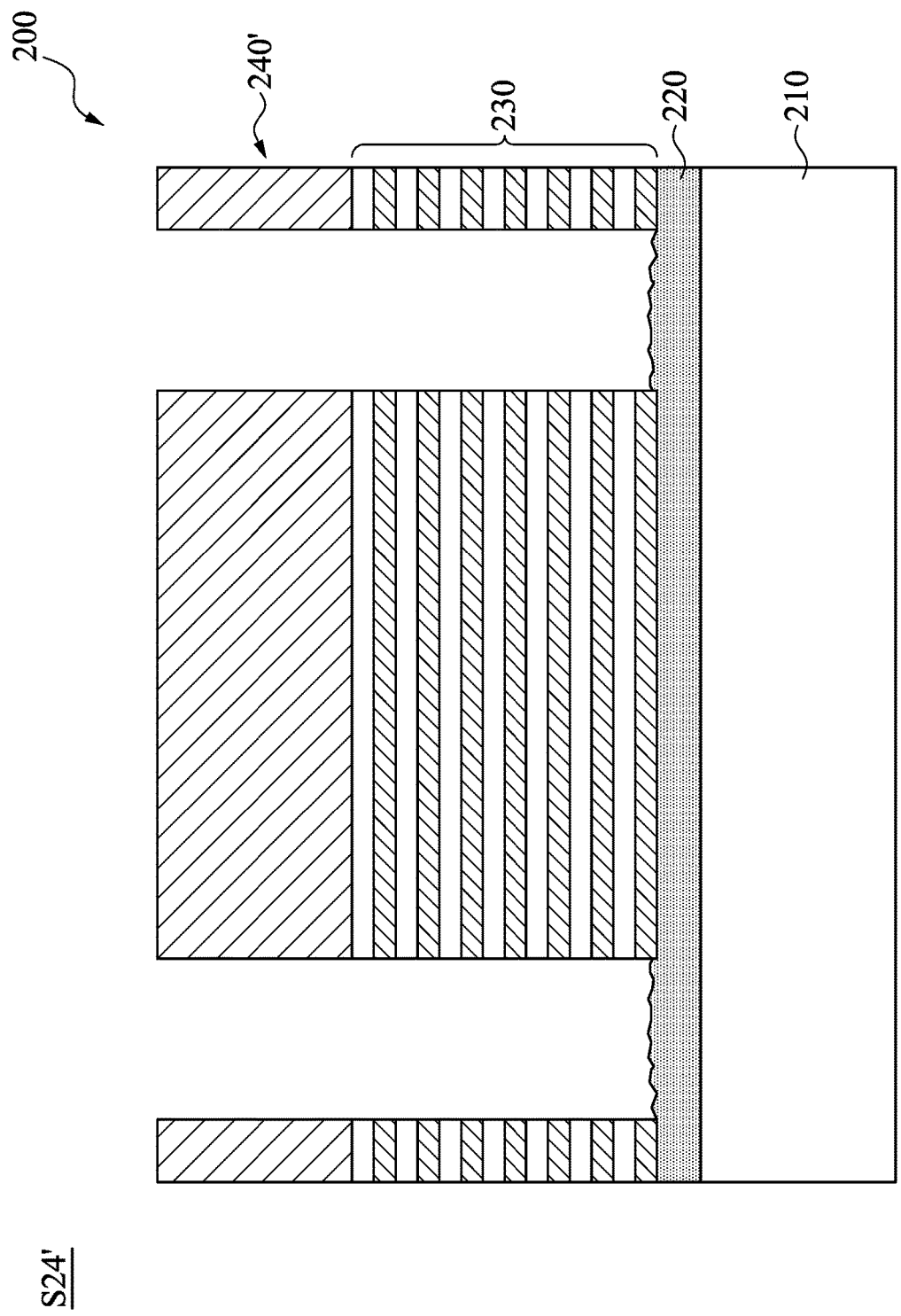
Figure 23:
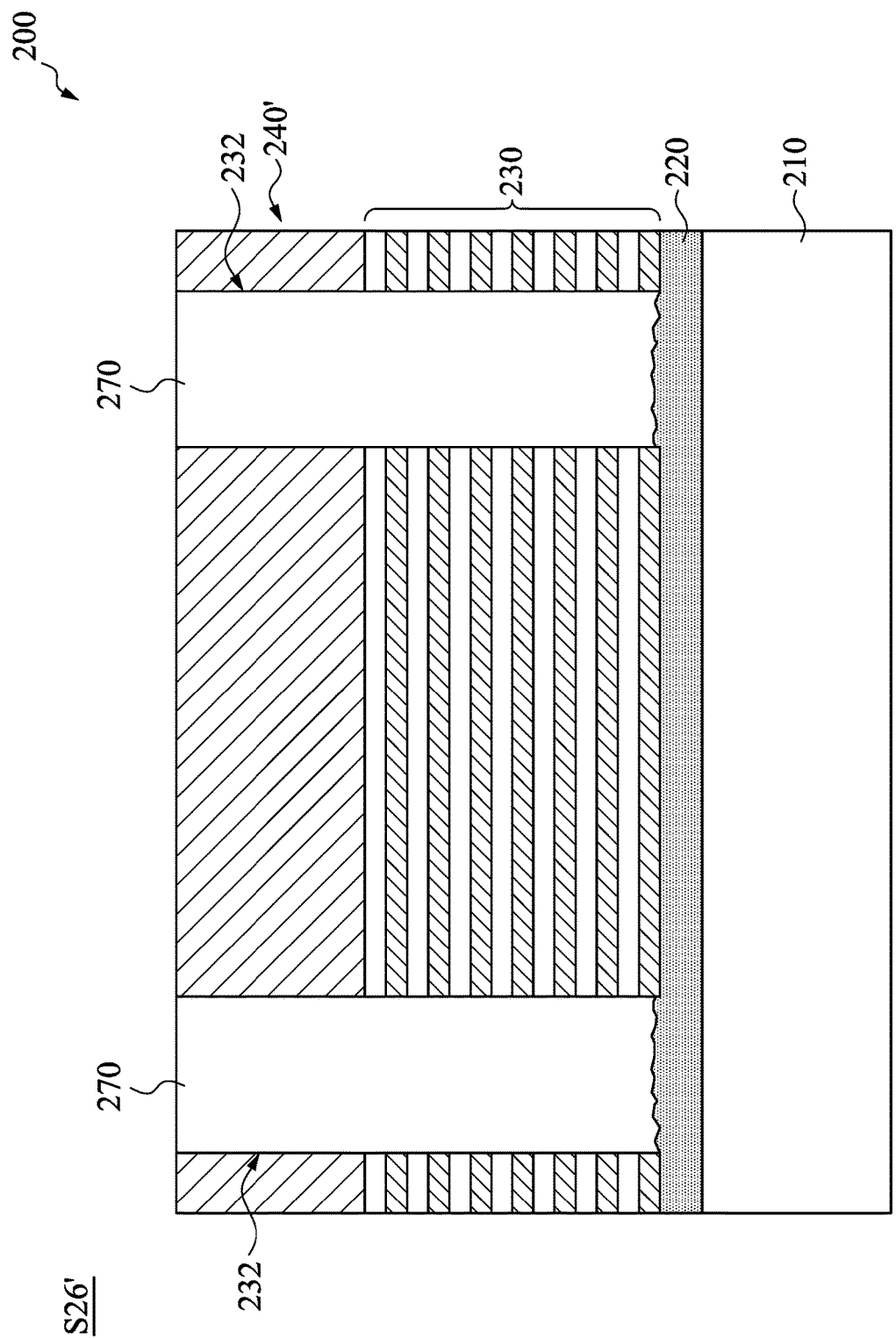
Figure 24:
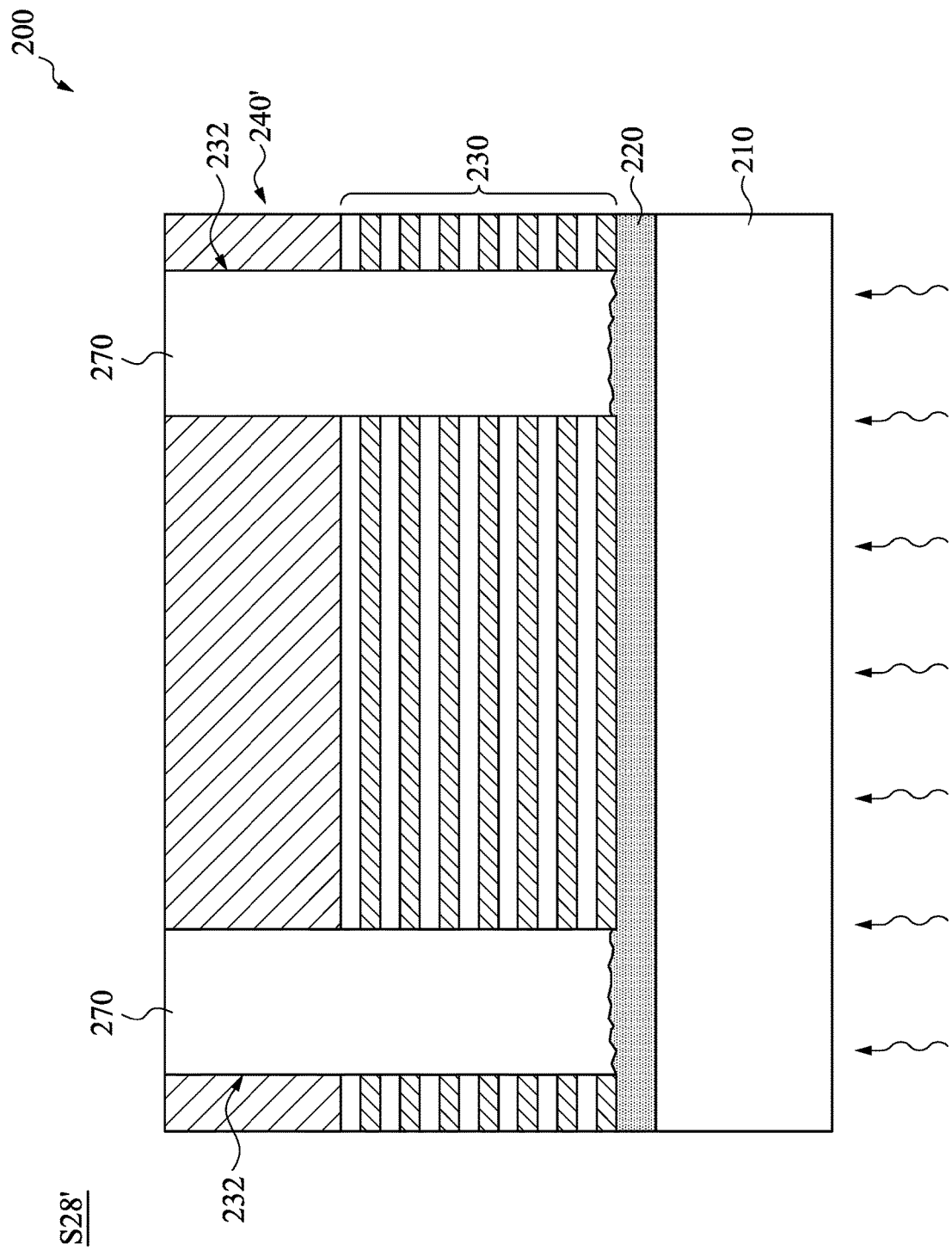
Figure 25:
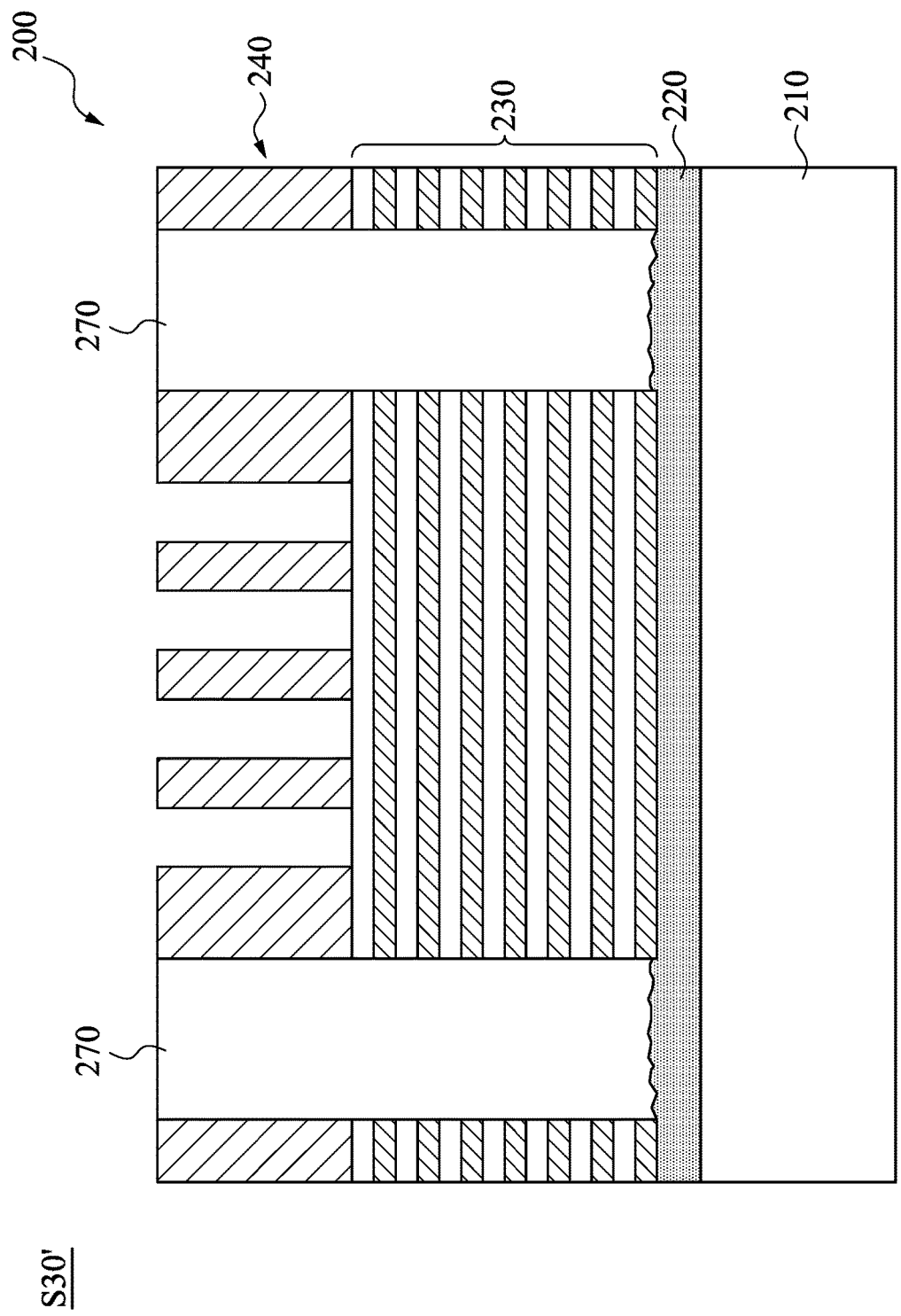

Reference is made to FIG. 19, which is a flowchart of a method of fabricating the reflective mask of FIG. 3 according to some embodiments of the present disclosure, and to FIGS. 20-25, which are cross-sectional views of different steps of the method. In some other embodiments, the opening 232 is formed before the absorption layer 240' is patterned to become the absorption pattern 240. Steps S10 to S18 are substantially the same as mentioned above, and are not further described herein. After the structure of step S18 (as shown in FIG. 10) having the substrate 210, the light absorbing layer 220, the reflective ML 230, and the absorption layer 240' is formed, the following steps are performed in order: step S20' in which the opening 232 is formed at the black border zone 20 of the reflective mask 200 (as shown in FIG. 20), step 22' in which the top surface of the exposed portion of the light absorbing layer 220 is roughened by the treatment 260 such as oxidation, bombardment, or the like (as shown in FIG. 21), step S24' in which the mask layer 250 is removed (as shown in FIG. 22), step S26' in which the opening 232 is filled with the filling material 270 (as shown in FIG. 23), step S28' in which a first baking process is performed to cure the filling material 270 (as shown in FIG. 24), and step S30' in which portions of the absorption layer 240' are etched to form the absorption pattern 240 over the reflective ML (as shown in FIG. 25). Steps S20', S22', S24', S26', S28', and S30' are similar to steps S22, S24, S30, S26, S28, and S20, respectively, and are not further described herein.

Some embodiments of the present disclosure provide a reflective mask having a light absorbing layer that has a portion free from coverage by the reflective ML at a black border zone. The light absorbing layer absorbs EUV and OoB light such as DUV light, such that unwanted radiation is not reflected to a photoresist layer during lithography. Additionally, the light absorbing layer can convert the absorbed light into thermal or electrical energy, and transmit these in a direction substantially parallel to the surface of the reflective mask substrate, such that the reflective mask does not overheat and become distorted.

According to some embodiments of the disclosure, a reflective mask includes a substrate, a light absorbing layer over the substrate, a reflective layer over the light absorbing layer, and an absorption pattern over the reflective layer. The reflective layer covers a first portion of the light absorbing layer, and a second portion of the light absorbing layer is free from coverage by the reflective layer.

In some embodiments, the light absorbing layer has a first thermal conductivity in a first direction substantially parallel to a top surface of the substrate and a second thermal conductivity in a second direction substantially perpendicular to the top surface of the substrate, and the first thermal conductivity is higher than the second thermal conductivity. In some embodiments, the light absorbing layer comprises an electrical conductor. In some embodiments, the reflective mask further incudes a grounding unit electrically connected to the light absorbing layer. In some embodiments, the reflective mask further incudes a filling material in the reflective layer and over the second portion of the light absorbing layer. In some embodiments, a roughness of a top surface of the second portion of the light absorbing layer is higher than a roughness of a top surface of the first portion of the light absorbing layer. In some embodiments, the light absorbing layer comprises $sp^2$-hybrid carbon atoms.

According to some embodiments of the disclosure, a reflective mask includes a substrate, a reflective layer over the substrate, a filling material in the reflective layer, a light absorbing layer interposed between the filling material and the substrate, and an absorption pattern over the reflective layer. In some embodiments, the light absorbing layer is configured to convert light into heat. In some embodiments, the light absorbing layer is configured to convert light into electricity. In some embodiments, the light absorbing layer is further between the reflective layer and the substrate. In some embodiments, the light absorbing layer has an anisotropic thermal conductivity. In some embodiments, the light absorbing layer comprises graphene, and a plane of the graphene of the light absorbing layer is substantially parallel to a top surface of the substrate. In some embodiments, the light absorbing layer comprises carbon nanotubes. In some embodiments, the light absorbing layer laterally extends across the filling material. In some embodiments, when viewed from a top view, a portion of the light absorbing layer under the filling material has a rectangular frame shape.

According to some embodiments of the disclosure, a method includes forming a light absorbing layer over a substrate. A reflective layer is formed over the light absorbing layer. An absorption pattern is formed over the reflective layer, and the reflective layer is etched to form an opening in the reflective layer to expose a portion of the light absorbing layer.

In some embodiments, a reflective mask incudes a substrate, a $sp^2$-hybrid carbon layer, a reflective multilayer, and an absorption pattern. The $sp^2$-hybrid carbon layer is over the substrate. The reflective multilayer is over the $sp^2$-hybrid carbon layer. The absorption pattern is over the reflective multilayer. In some embodiments, the $sp^2$-hybrid carbon layer is made of at least one of graphene or graphite. In some embodiments, the $sp^2$-hybrid carbon layer comprises a plurality of carbon nanotubes. In some embodiments, the $sp^2$-hybrid carbon layer is in contact with the reflective multilayer. In some embodiments, the reflective mask further incudes a filling material extending through the reflective multilayer, the $sp^2$-hybrid carbon layer below the filling material having a higher surface roughness than below the reflective multilayer. In some embodiments, the reflective mask further incudes a grounding unit in contact with a lateral end of the $sp^2$-hybrid carbon layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A reflective mask, comprising:
    a substrate;
    a light absorbing layer over the substrate;
    a reflective layer over the light absorbing layer, wherein the reflective layer covers a first portion of the light absorbing layer, and a second portion of the light absorbing layer is free from coverage by the reflective layer; and
    an absorption pattern over the reflective layer.

2. The reflective mask of claim 1, wherein the light absorbing layer has a first thermal conductivity in a first direction substantially parallel to a top surface of the substrate and a second thermal conductivity in a second direction substantially perpendicular to the top surface of the substrate, and the first thermal conductivity is higher than the second thermal conductivity.

3. The reflective mask of claim 1, wherein the light absorbing layer comprises an electrical conductor.

4. The reflective mask of claim 1, further comprising:
    a grounding unit electrically connected to the light absorbing layer.

5. The reflective mask of claim 1, further comprising:
    a filling material in the reflective layer and over the second portion of the light absorbing layer.

6. The reflective mask of claim 1, wherein a roughness of a top surface of the second portion of the light absorbing layer is higher than a roughness of a top surface of the first portion of the light absorbing layer.

7. The reflective mask of claim 1, wherein the light absorbing layer comprises $sp^2$-hybrid carbon atoms.

8. A reflective mask, comprising:
a substrate;
a reflective layer over the substrate;
a filling material in the reflective layer;
a light absorbing layer interposed between the filling material and the substrate; and
an absorption pattern over the reflective layer.

9. The reflective mask of claim 8, wherein the light absorbing layer is further between the reflective layer and the substrate.

10. The reflective mask of claim 8, wherein the light absorbing layer laterally extends across the filling material.

11. The reflective mask of claim 8, wherein when viewed from a top view, a portion of the light absorbing layer under the filling material has a rectangular frame shape.

12. The reflective mask of claim 8, wherein the light absorbing layer has an anisotropic thermal conductivity.

13. The reflective mask of claim 8, wherein the light absorbing layer comprises graphene, and a plane of the graphene of the light absorbing layer is substantially parallel to a top surface of the substrate.

14. The reflective mask of claim 8, wherein the light absorbing layer comprises carbon nanotubes.

15. A reflective mask, comprising:
a substrate;
a $sp^2$-hybrid carbon layer over the substrate;
a reflective multilayer over the $sp^2$-hybrid carbon layer; and
an absorption pattern over the reflective multilayer.

16. The reflective mask of claim 15, wherein the $sp^2$-hybrid carbon layer is made of at least one of graphene or graphite.

17. The reflective mask of claim 15, wherein the $sp^2$-hybrid carbon layer comprises a plurality of carbon nanotubes.

18. The reflective mask of claim 15, wherein the $sp^2$-hybrid carbon layer is in contact with the reflective multilayer.

19. The reflective mask of claim 15, further comprising a filling material extending through the reflective multilayer, the $sp^2$-hybrid carbon layer below the filling material having a higher surface roughness than below the reflective multilayer.

20. The reflective mask of claim 15, further comprising a grounding unit in contact with a lateral end of the $sp^2$-hybrid carbon layer.

* * * * *